US007521708B1

(12) United States Patent
Agassi (10) Patent No.: US 7,521,708 B1
(45) Date of Patent: Apr. 21, 2009

(54) HIGH SENSITIVITY RING-SQUID MAGNETIC SENSOR

(75) Inventor: Yehoshua Dan Agassi, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 292 days.

(21) Appl. No.: 11/025,820

(22) Filed: Dec. 29, 2004

(51) Int. Cl.
*H01L 29/06* (2006.01)
(52) U.S. Cl. .............................. 257/31; 257/30; 257/38
(58) Field of Classification Search ............. 257/30–39, 257/421–427
See application file for complete search history.

(56) References Cited

U.S. PATENT DOCUMENTS

| 6,627,915 | B1 * | 9/2003 | Ustinov et al. ................ 257/31 |
| 6,635,368 | B1 | 10/2003 | Agassi |
| 6,961,597 | B1 | 11/2005 | Agassi |
| 2002/0177529 | A1 * | 11/2002 | Ustinov ...................... 505/100 |
| 2005/0052181 | A1 * | 3/2005 | Lam et al. ................... 324/242 |

OTHER PUBLICATIONS

John Clarke and Roger H. Koch, "The Impact of High-Temperature Superconductivity on SQUID Magnetometers," *Science*, vol. 242, pp. 217-223 (Oct. 14, 1988).
Ienari Iguchi, Kiejin Lee, Wan Wang, Masashi Tachiki, Kazuto Hirata, Takashi Mochiku, "Observation of Josephson Plasma Emission by Quasiparticle Injection into a $Bi_2Sr_2CaCu_2Oy$ Single Crystal," *Journal of Low Temperature Physics*, vol. 117, Nos. 3/4, pp. 617-621 (Nov. 1999).
M. I. Faley, U. Poppe, K. Urban, H. Hilgenkamp, H. Hemmes, W. Aarnink, J. Flokstra, and H. Rogalla, Noise Properties of Direct Current SQUIDs with Quasiplanar $Yba_2Cu_3O_7$ Josephson Junctions, *Applied Physics Letters*, vol. 67, No. 14, pp. 2087-2089 (Oct. 2, 1995).
Masashi Tachiki and Masahiko Machida, "Current Understanding of Josephson Plasma Theory and Experiments in HTSC," *Physica C*, vol. 341-348, pp. 1493-1498 (Nov. 2000).
M. Machida, T. Koyama, A. Tanaka, and M. Tachiki, "Collective Dynamics of Josephson Vortices in Intrinsic Josephson Junctions: Exploration of In-Phase Locked Superradiant Vortex Flow States," *Physica C*, vol. 330, pp. 85-93 (Mar. 1, 2000).

(Continued)

*Primary Examiner*—Thinh T Nguyen
(74) *Attorney, Agent, or Firm*—Howard Kaiser (57) ABSTRACT

More sensitive (especially due to reduced interference of flux noise) than a conventional SQUID, an inventive SQUID's major component is a hollow cylindric structure comprising one or more annular Josephson junctions. Each annular Josephson junction is defined by two superconductive annuli and an interposed non-superconductive annulus. Inventive practice is variable, e.g., in terms of number and/or spacing of Josephson junctions, and/or as having one or more shunts connecting two or more Josephson junctions, and/or as having one or more vortices each threaded through a Josephson junction. The inventive cylindric structure is positioned proximate a magnetic field of interest so that the latter is aligned with the longitudinal axis of the former. Electrical current is transmitted through the inventive cylindric structure in the longitudinal-axial direction so that, based on the quantum interference associated with the one or more annular Josephson junctions, the measured output voltage is indicative of the magnetic field.

15 Claims, 7 Drawing Sheets

OTHER PUBLICATIONS

John Clarke, "Principles and Applications of SQUIDS," *Proceedings of the IEEE*, vol. 77, No. 8, pp. 1208-1223 (Aug. 1989).

A. V. Ustinov and S. Sakai, "Submillimeter-Band High-Power Generation Using Multilayered Josephson Junctions," *Applied Physics Letters*, vol. 73, No. 5, pp. 686-688 (Aug. 3, 1998).

D. Agassi, "Intrinsic 1/f Noise in a Superconductor Strip," *Physica C*, vol. 371, Issue 1, pp. 34-44 (Jun. 1, 2002; available online Dec. 9, 2001).

Yong-Joo Doh, Hu-Jong Lee, and Hyun-Sik Chang, "Progressive Evolution of Tunneling Characteristics of In Situ Fabricated Intrinsic Josephson Junctions in $Bi_2Sr_2CaCu_2O_{8+\delta}$ Single Crystals," *Physical Review B*, vol. 61, No. 5, pp. 3620-3628 (Feb. 1, 2000).

W. A. Little and R. D. Parks, "Observation of Quantum Periodicity in the Transition Temperature of a Superconducting Cylinder," *Physical Review Letters*, vol. 9, No. 1, pp. 9-12 (Jul. 1, 1962).

R. D. Parks and W. A. Little, "Fluxoid Quantization in a Multiply-Connected Superconductor," *Physical Review*, vol. 133, No. 1A, pp. A97-A103 (Jan. 6, 1964).

E. Goldobin, A. Wallraff, N. Thyssen, and A. V. Ustinov, "Cherenkov Radiation in Coupled Long Josephson Junctions," *Physical Review B*, vol. 57, No. 1, pp. 130-133 (Jan. 1, 1998).

R. P. Groff and R. D. Parks, Fluxoid Quantization and Field-Induced Depairing in a Hollow Superconducting Microcylinder, *Physical Review*, vol. 176, No. 2, pp. 567-580 (Dec. 10, 1968).

G. Hechtfischer, R. Kleiner, A. V. Ustinov and P. Muller, "Non-Josephson Emission from Intrinsic Junctions in $B_1Sr_2CaCu_2O_{8+y}$: Cherenkov Radiation by Josephson Vortices," *Physical Review Letters*, vol. 79, No. 7, pp. 1365-1368 (Aug. 18, 1997).

M. Machida, T. Koyama, and M. Tachiki, "Dynamical Breaking of Charge Neutrality in Intrinsic Josephson Junctions: Common Origin for Microwave Resonant Absorptions and Multiple-Branch Structures in the I-V Characteristics," *Physical Review Letters*, vol. 83, No. 22, pp. 4618-4621 (Nov. 29, 1999).

A. Yurgens, D. Winkler, T. Claeson, S. Ono, and Yoichi Ando, "Intrinsic Tunneling Spectra of $Bi_2(Sr_{2-x}La_x)CuO_{6+\delta}$," *Physical Review Letters*, vol. 90, No. 14, pp. 147005-1 to 147005-4 (Apr. 11, 2003).

H. B. Wang, Y. Aruga, J. Chen, K. Nakajima, T. Yamashita, and P. H. Wu, "Individual Shapiro Steps Observed in Resistively Shunted Intrinsic Josephson Junctions on $Bi_2Sr_2CaCu_2O_{8+X}$ Single Crystals," *Applied Physics Letters*, vol. 77, No. 7, pp. 1017-1019 (Aug. 14, 2000).

H. B. Wang, P. H. Wu, J. Chen, K. Maeda, and T. Yamashita, Three-Dimensional Arrays of BiSrCaCuO-2212 Intrinsic Josephson Junctions and Zero-Crossing Shapiro Steps at 760 GHz, *Applied Physics Letters*, vol. 80, No. 9, pp. 1604-1606 (Mar. 4, 2002).

A. Wallraff, A. V. Ustinov, V. V. Kurin, I. A. Shereshevsky, and N. K. Vdovicheva, "Whispering Vortices," *Physical Review Letters*, vol. 84, No. 1, pp. 151-154 (Jan. 3, 2000).

A. V. Ustinov, T. Doderer, R. P. Huebener, N. F. Pederson, B. Mayer, and V. A. Oboznov, "Dynamics of Sine-Gordon Solitons in the Annular Josephson Junction," *Physical Review Letters*, vol. 69, No. 12, pp. 1815-1818 (Sep. 21, 1992).

S. Keil, I. V. Vernik, T. Doderer, A. Laub, H. PreBler, and R. P. Huebener, "Magnetic Flux Quanta in Annular Josephson Junctions in a Barrer-Parallel DC Magnetic Field," *Physical Review B*, vol. 54, No. 21, pp. 14,948-14,951 (Dec. 1, 1996).

Alexey V. Ustinov, "Fluxon Insertion into Annular Josephson Junctions," *Applied Physics Letters*, vol. 80, No. 17, pp. 3153-3155 (Apr. 29, 2002).

J. Zitzmann and A. V. Ustinov, "Super-Relativistic Fluxon in a Josephson Multilayer: Experiment and Simulation," *Physical Review B*, vol. 66, pp. 064527-1 to 064527-7 (Aug. 29, 2002).

Alexey V. Ustinov, Boris A. Malomed, and Shigeki Sakai, "Bunched Fluxon States in One-Dimensional Josephson-Junction Arrays," *Physical Review B*, vol. 57, No. 18, pp. 11,691-11,697 (May 1, 1998).

E. Goldobin, B. A. Malomed, and A. V. Ustinov, "Maximum Velocity of a fluxon in a stack of Coupled Josephson Junctions," *Physics Letters A*, vol. 266, pp. 67-75 (Feb. 14, 2000).

\* cited by examiner

FIG. 1

PRIOR ART

FIG. 2

PRIOR ART

HIGH SENSITIVITY RING-SQUID MAGNETIC SENSOR

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to superconductivity, more particularly to methods and devices using superconductivity for detecting or measuring magnetic fields or magnetic field gradients.

A "superconducting quantum interference device" (commonly referred to as a "SQUID") is the most sensitive kind of magnetic field detector that is currently known. The material composition of a SQUID typically includes niobium and/or a lead alloy (e.g., lead-gold alloy or lead-indium alloy). The two main types of SQUID are "dc SQUID" (direct current SQUID) and "rf SQUID" (radio frequency SQUID). An rf SQUID is also referred to as an "ac SQUID" (alternating current SQUID). An rf SQUID has only one Josephson junction, whereas a dc SQUID has two or more Josephson junctions. Generally, dc SQUIDs are more sensitive than rf SQUIDS. The principle of operation of a SQUID relates to the physical phenomenon known as "flux quantization," according to which a superconductor loop tends to favor states in which the flux inside the superconductor loop is a multiple of the flux quantum.

A typical dc SQUID includes a superconducting loop and two Josephson junctions that interrupt the superconducting loop at two respective locations. A "Josephson junction" consists of two superconducting regions and a non-superconducting region (e.g., a thin layer of insulating material) that is sandwiched between the two superconducting regions. A Josephson junction thus represents an interface between two superconducting materials that are separated by a non-superconducting (e.g., insulating) barrier. In a Josephson junction, electrons "tunnel" through the non-superconducting region according to the "Josephson effect." When sufficient electrical current is conducted across a SQUID, a voltage is generated that is indicative of or related to the strength of a proximate magnetic field.

SQUIDs have been used in a variety of applications (e.g., scientific, medical, engineering, geological) demanding extreme sensitivity. A SQUID measures changes in a magnetic field with great sensitivity. However, SQUID sensitivity is subject to compromise by flux noise such as that which is associated with thermal noise and/or random vortex motion. The most sensitive SQUIDs available today are the dc SQUIDs having a low temperature superconductor (LTS) composition and operating at T=4.2K with liquid He as coolant. This dc SQUID describes a single superconductor loop discontinued by two Josephson junctions and ancillary structures such as a pickup coil. See, e.g., A. Barone and G. Paterno, *Physics and Applications of the Josephson Effect*, John Wiley and Sons, New York, 1982, incorporated herein by reference; J. Clarke, *Poc. of IEEE* 77, 1208 (1989), incorporated herein by reference; D. Koelle, R. Kleiner, F. Ludwig, E. Dankster and J. Clarke, *Rev. Mod. Phys.* 71, 631 (1999), incorporated herein by reference.

SUMMARY OF THE INVENTION

In view of the foregoing, it is an object of the present invention to provide a more sensitive SQUID device.

In accordance with typical embodiments of the present invention, a device is suitable for use as part of a magnetic sensing system such as a SQUID-based system. The inventive device comprises a hollow cylindric (e.g., cylindrical, cylindroidal or prismatic) structure having a geometric longitudinal axis. The hollow cylindric structure includes at least three annular layers, the at least three annular layers being at least one annular non-superconductive layer and at least two annular superconductive layers. The at least three annular layers include at least one combination of two annular superconductive layers and an annular non-superconductive layer situated therebetween. The at least one combination represents at least one annular Josephson junction, each combination representing an annular Josephson junction. According to typical inventive practice, the hollow cylindric structure has a geometric longitudinal axis. The hollow cylindric structure and a magnetic field are relatively positioned so that the magnetic field is aligned with the geometric longitudinal axis and passes through the interior space of the hollow cylindric structure. Electrical current is conducted through the hollow cylindric structure along the geometric longitudinal axis so as to produce a measurable voltage that is indicative of a value of the magnetic field. Generally speaking, each annular Josephson junction manifests quantum interference with respect to the conduction of electrical current. The measured voltage's indicativeness as to a magnetic field of interest is related to the quantum interference or interferences characterizing the inventive device's Josephson junction or junctions. Inventive variants include generation in the device of one or more vortices in one or more Josephson junctions (e.g., generation in the device of plural, concerted vortices in plural Josephson junctions), and structural incorporation in the inventive device of one or more shunts connecting two or more Josephson junctions.

According to usual inventive practice, an inventive SQUID device comprises one or more annular Josephson junctions. Some inventive embodiments comprise plural annular Josephson junctions (referred to herein as a "stack" of Josephson junctions), which are coaxially arranged so as to geometrically form a "cylindric" shape. Geometrically pure or perfect circularity of inventive structure is not a requirement of inventive practice. A Josephson junction in accordance with the present invention can manifest any cylindric shape, whether it be a cylindrical shape or a non-cylindrical (e.g., prismatic) shape. Generally speaking, a Josephson junction according to inventive practice is broadly described herein as "cylindric," wherein the term "cylindric" denotes characterization by a shape defining the lateral surface of a geometric "cylindric solid." A cylindric solid is a three-dimensional geometric figure that includes a lateral surface and two congruent bases lying in parallel geometric planes. Geometrically speaking, "cylindric solids" include, but are not limited to, cylinders (wherein the bases are circular), cylindroids (wherein the bases are elliptical), and prisms (wherein the bases are polygonal). Cylindric solids can be irregularly shaped and/or combine indicia of rectilinearity and curvilinearity. Thus, subsets of the descriptor "cylindric" include descriptors such as "cylindrical," "cylindroidal" and "prismatic," and inventive structures can define or approximately define any of these or other "cylindric" shapes. An inventively practiced "prismatic" structure, for instance, can describe a prism having any number of (at least three) lateral sides, e.g., a triangular prism (which includes 3 lateral sides), a quadrilateral prism (which includes four lateral sides), a pentagonal prism (which includes five lateral sides), a hexagonal prism (which includes six lateral sides), etc. The terms "annulus," "annular," "ring," and "ring-shaped," as used herein in association with the present invention (such as used adjectively with the term "Josephson junction"), denote characterization by a cylindric shape. The terms "annular" and "ring-shaped" are synonymous with the term "cylindric," and may also connote hollowness and a relatively short axial length (as compared with transverse width, e.g., diameter) in a form akin to that of an "annulus" or "ring" as commonly understood.

The basic structural component of the present invention's new SQUID device is an annular Josephson junction. At the core of the inventive SQUID is one annular Josephson junction, or a stack of annular Josephson junctions. During inventive sensing/detection, the probe field (i.e., the magnetic field to be measured) threads through the hole(s) of the annular Josephson junction(s). As pointed out hereinabove, the annular hole(s) need not be precisely circular. The present invention's core SQUID structure is adaptable to association with the same or similar auxiliary structures (such as the washer, cryogenics, etc.) that are used in association with conventional SQUIDs.

Notwithstanding the dearth of testing of inventive concepts, the present invention's new geometry for a SQUID-type magnetometer (or gradiometer) is believed to be characterized by enhanced sensitivity over that of the most sensitive SQUID-type magnetometers (or gradiometers) that are currently available, viz., the dc SQUID magnetometers (or gradiometers). The enhanced sensitivity is inventively achieved through a reduction in the interference of flux noise with the signal, as well as through a potential increase in the transfer function. The present invention's new SQUID geometry is applicable to any magnetic sensor technology, and can be embodied as, or as part of, a magnetometer or a gradiometer or any other related magnetic sensor.

A broad range of design parameters is available to the inventive practitioner, who is afforded great flexibility in exercising his/her discretion toward achieving optimization. Generally in inventive practice, numerical simulations and/or experimentation will guide a specific choice. The inventive parameters include, but are not limited to, the following: (i) the superconductor material of an annular Josephson junction; (ii) the buffer layer material of an annular Josephson junction; (iii) the dimensions (e.g., radius and width) of an annular Josephson junction; (iv) for a stack of annular Josephson junctions, the distance between adjacent buffer layers; (v) the presence or absence of—and if present, the nature of (e.g., in terms of location and direction)—at least one vortex, threaded in at least one annular Josephson junction; (vi) the presence or absence of—and if present, the nature of (e.g., in terms of location and size)—at least one electrically conductive shunt, connected to at least one annular Josephson junction.

Various inventive methods can be practiced for fabricating an annular Josephson junction. For instance, the inventive practitioner can make or obtain a planar Josephson junction, a sandwich-like object that consists of two superconducting slabs separated by a "thin" (smaller than the coherence length) non-superconducting (e.g., insulating or metallic) layer. A circular hole is machined (e.g., bored or drilled) in the sandwich, and a circular perimeter is machined around the periphery of the sandwich. A similar inventive approach can be taken for making an inventive stack of plural annular Josephson junctions. For instance, a bore can be drilled in a laminar assembly of alternating superconductor layers and non-superconductor layers that describe two or more planar Josephson junctions. The assembly can be made by taking plural planar Josephson junctions and adjacently situating planar superconductor layers therebetween. Alternatively, the assembly can be made by alternately and adjacently situating layers of superconductor and non-superconductor material. In making an inventive device, a useful guideline is that the width of a Josephson junction annulus should be larger than the penetration depth, thereby avoiding flux leakage from inside the bore to the outside of the inventive device.

As distinguished from primarily or strictly man-made annular Josephson junctions, some inventive embodiments obtain annular Josephson junctions from the intrinsic quality of a single-crystal sample; here, the naturally occurring stacked planar Josephson junctions are adaptable to forming an inventive stack of annular Josephson junctions. Layered superconductors, such as the high temperature superconductors, are of particularly note in this regard in that their crystal structure already constitutes a densely packed Josephson junction stack in the c-axis direction. Two options are available to the inventive practitioner to realize the annular Josephson junction configuration based on a naturally layered superconductor. As a first option, the superconductor crystal can be machine-shaped (e.g., interiorly bored and exteriorly rounded) into a thick annulus (ring). As a second option, a-axis HTS thin-films can be deposited and combined with nonsuperconductor material in such a manner as to form an inventive configuration representing at least one Josephson junction, each Josephson junction being formed by three coaxial components, viz., a pair of banks (composed of a-axis HTS thin-film material) and a correspondingly shaped Josephson junction buffer layer (composed of non-superconductor material) positioned therebetween. For instance, each bank can be formed by at least three adjacent, planar, a-axis HTS thin-film sides, wherein each a-axis HTS thin-film represents a geometric side of a geometric prism. Thus, for example, three a-axis HTS thin-film sides form a triangular prism shape, four a-axis HTS thin-film sides form a quadrilateral prism shape, etc. Again, the precise shape of the bore of the inventive Josephson junction stack is not important.

Other objects, advantages and features of this invention will become apparent from the following detailed description of the invention when considered in conjunction with the accompanying drawings.

BRIEF DESCRIPTION OF THE DRAWINGS

Generally throughout the figures, electrical currents are represented by thinner lines, and magnetic fields are represented by thicker lines. The present invention will now be described, by way of example, with reference to the accompanying drawings, wherein:

FIG. 7A, FIG. 7B, FIG. 7C and FIG. 7D are partial edgewise views of an inventive embodiment of an annular Josephson junction, particularly illustrating a vortex that is threaded through the annular Josephson junction in accordance with the present invention. FIG. 7A illustrates the vortex in the absence of an applied (bias) current, an induced current and a magnetic field. FIG. 7B illustrates the vortex in the presence of an applied (bias) current and an induced current, and in the absence of a magnetic field. FIG. 7C illustrates the vortex in the presence of a magnetic field, and in the absence of an applied (bias) current and an induced current. FIG. 7D illustrates the vortex in the presence of an applied (bias) current, an induced current and a magnetic field.

DETAILED DESCRIPTION OF THE INVENTION

A superconductor having a multiply connected topology (e.g., a superconductor with one or more holes) has the following unique attribute: In the presence of a magnetic field, the allowable magnetic flux (defined as magnetic field times area) through a hole is "quantized"; that is, the allowable magnetic flux assumes only values which are multiples of a fundamental flux-quantum, denoted by $\Phi_0$, notwithstanding the continuous variation of the applied magnetic and regardless of the superconductor material or the hole's shape. This remarkable property is a macroscopic manifestation of the superconducting-state quantum nature; see, e.g., page 14 of M. Tinkham, *Introduction to Superconductivity*, Second Edition, McGraw-Hill, Inc., New York, 1996, incorporated herein by reference.

Figure 1:
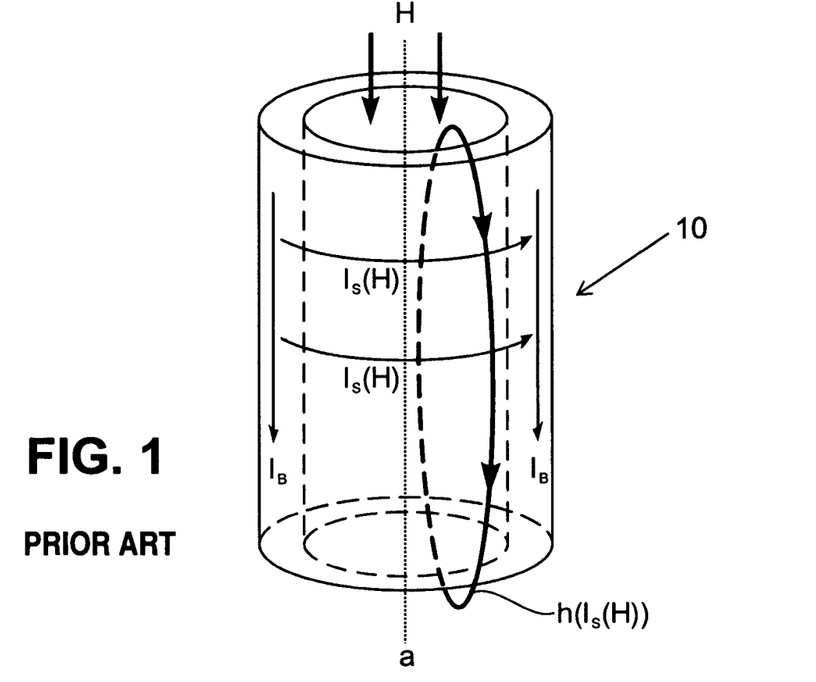
FIG. 1 is a perspective view of equipment used in the classic Parks-Little experiment relating to superconductivity.

Referring now to FIG. 1, flux quantization was experimentally demonstrated in the classical Parks-Little experiment. See the aforementioned M. Tinkham, *Introduction to Superconductivity*, Second Edition, McGraw-Hill, Inc., New York, 1996, pages 128-130; see also, W. A. Little and R. D. Parks, *Phys. Rev. Lett.* 9, 9 (1962), incorporated herein by reference; W. A. Little and R. D. Parks, *Phys. Rev.* 133 A97 (1964), incorporated herein by reference; R. P. Groff and R. D. Parks, *Phys. Rev.* 176, 567 (1968), incorporated herein by reference. Shown in FIG. 1 are the electrical currents and magnetic fields pertaining to a finite width superconductor cylinder 10 in the presence of an external field H (the object of measurement) and a bias current $I_B$. The superconductor cylinder 10 volume is indicated by the cross-sectional gray area. The induced electrical current and the induced magnetic field are denoted by $I_S(H)$ and $h(I_S(H))$, respectively.

As shown in FIG. 1, the Parks-Little experimental setup includes a thin superconductor cylinder 10 (made of Sn, Sn—In alloys), which is caused to be in the presence of a magnetic probe-field H and a bias current $I_B$. Magnetic probe-field H is aligned along the longitudinal axis of symmetry a of cylinder 10, and bias current $I_B$ flows longitudinally along the cylinder 10. In response to the presence of H, screening currents $I_S(H)$ flow around the cylinder 10 in a direction such that the associated magnetic field compensates the probe field as much as possible. Flux quantization, however, mandates that for an increasing H the screening current $I_S(H)$ is a periodic function (not an increasing function) in the applied magnetic field.

To register the periodicity of $I_S(H)$, the Parks-Little experiment relies on the superconductor gap function (hereinafter referred to as "gap") dependence on the current and temperature, i.e., a monotonous decrease with an increase in current flow and/or temperature. See the aforementioned M. Tinkham, *Introduction to Superconductivity*, Second Edition, McGraw-Hill, Inc., New York, 1996, pages 123-124 and 128-130. The critical temperature $T_c$, defined as the maximum temperature for which the superconductive state is sustainable, is therefore the temperature at which the gap vanishes. In the Parks-Little experiment, cylinder 10 is kept at a temperature near the critical temperature $T_c$. Therefore, the $I_S(H)$ current flow varies the gap, resulting in a current-dependent $T_c$ that varies periodically in H. Consequently, cylinder 10 straddles between its normal (resistive) and superconducting (non-resistive) states periodically in H. This variation, in turn, is measured by recording the periodic voltage variation on the I-V curve associated with the chosen bias $I_B$.

The configuration depicted in FIG. 1 may, in principle, also operate as a magnetometer. However, this Parks-Little device, in operation mode, requires a temperature at very close to $T_c$, which is impractical for the vast majority of potential applications. As further discussed hereinbelow with reference to FIG. 3, FIG. 4, FIG. 5 and FIG. 6, the present invention circumvents this Parks-Little limitation by taking a novel approach for registering $I_S(H)$—in particular, through the present invention's unique insertion of one or more "annular Josephson junctions."

In a Josephson junction, the Josephson junction buffer layer is a "weak link" between two adjacent superconductors (the Josephson junction banks). The buffer layer is, for example, a thin insulating film (shorter than the coherence length), or a thin metallic film, or a constriction. See the aforementioned M. Tinkham, *Introduction to Superconductivity*, Second Edition, McGraw-Hill, Inc., New York, 1996, Chapter 6; see also, A. Barone and G. Paterno, *Physics and Applications of the Josephson Effect*, John Wiley and Sons, New York, 1982, incorporated herein by reference; J. Clarke, *Poc. of IEEE* 77, 1208 (1989), incorporated herein by reference.

An important parameter characterizing the I-V curve shape of a Josephson junction is the Josephson critical current $I_c^{JJ}$, defined as the maximum transport current across the Josephson junction before it goes resistive and develops a voltage. This parameter depends on the gap, as well. See M. Tinkham, *Introduction to Superconductivity*, Second Edition, McGraw-Hill, Inc., New York, 1996, page 200, incorporated herein by reference; T. Van Duzer and C. W. Turner, *Principles of Superconductive Devices and Circuits*, Elsevier, N.Y., 1981, pages 142 and 152-164. A rough estimate of this dependence is derived from the relation $I_c^{JJ} * R_N = (\pi \Delta/2|e|) \mathrm{Tan}\, h(\Delta/k_B T)$, where the symbols $R_N$, $\Delta$, $|e|$, $k_B$, Tan h denote the normal-state resistance, the superconductor gap, the electron charge, the Boltzmann constant and the hyperbolic tangent function, respectively. See the following aforementioned references: M. Tinkham, *Introduction to Superconductivity*, Second Edition, McGraw-Hill, Inc., New York, 1996, page 200, incorporated herein by reference; T. Van Duzer and C. W. Turner, *Principles of Superconductive Devices and Circuits*, Elsevier, N.Y., 1981, page 142.

Consequently, a variation in gap due to the flow of $I_S(H)$ implies a corresponding variation in $I_c^{JJ}$, which can be measured by means of detecting a voltage variation at a judiciously chosen value of $I_B$. This approach for registering current flow eliminates the constraint of operating at temperature near $T_c$. The use of Josephson junctions for registering H-periodic screening currents, and thereby H, has been known in non-inventive SQUID-type configurations that include one or more Josephson junctions, ancillary structures and electronics. Generally, the SQUID class of devices acts as a magnetic-flux-to-voltage transducer. See the following aforementioned references: M. Tinkham, *Introduction to Superconductivity*, Second Edition, McGraw-Hill, Inc., New York, 1996, Chapter 6; A. Barone and G. Paterno, *Physics and Applications of the Josephson Effect*, John Wiley and Sons, New York, 1982; J. Clarke, *Poc. of IEEE* 77, 1208 (1989).

Figure 2:
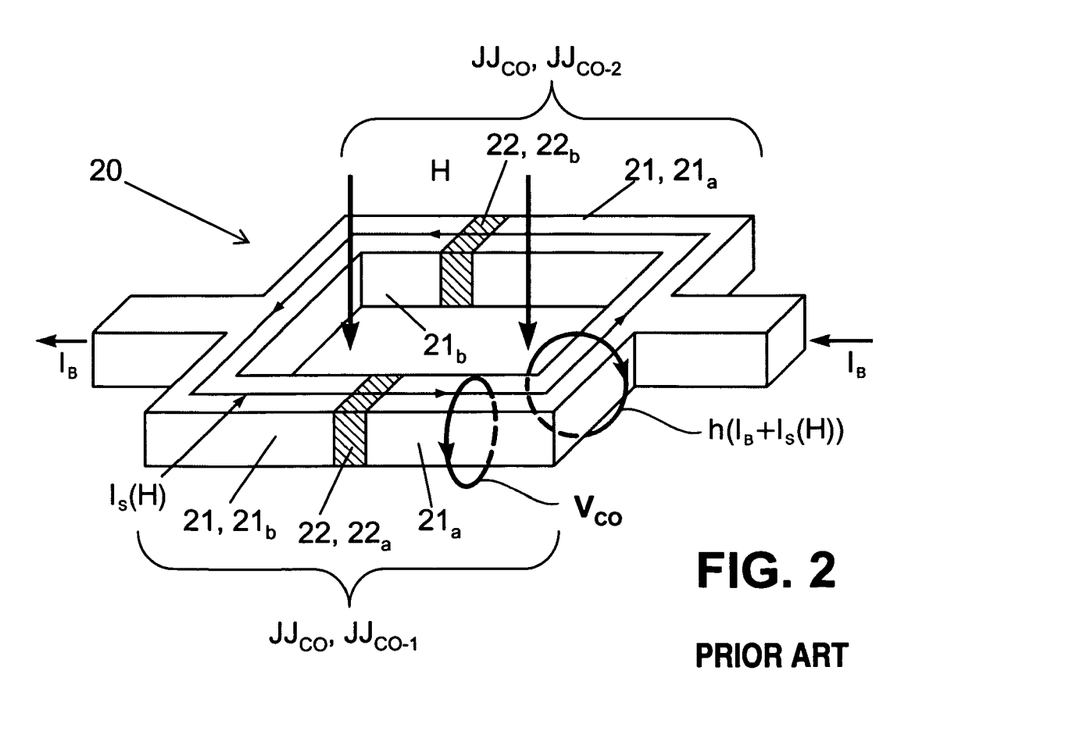
FIG. 2 is a perspective view of the core structure of a conventional dc SQUID.

FIG. 2 shows the standard geometry that is the core element of a conventional dc SQUID. With reference to FIG. 2, the most sensitive SQUID currently known is the dc SQUID. The generic structure of conventional dc SQUID core structure 20, schematically depicted in FIG. 2, includes a superconductor loop 21 interrupted by two conventional Josephson junctions $JJ_{CO}$ (viz., $JJ_{CO-1}$ and $JJ_{CO-2}$) in the presence of a bias current $I_B$. Josephson junction $JJ_{CO-1}$ is formed by a buffer layer $22_a$ and two banks $21_a$ and $21_b$, which are on opposite sides of buffer layer $22_a$. Josephson junction $JJ_{CO-2}$ is formed by a buffer layer $22_b$ and the same two banks $21_a$ and $21_b$, which are on opposite sides of buffer layer $22_b$. The probe-field H, which threads through the entire superconductor loop 21, invokes a screening current $I_S(H)$ around the loop 21, which combines with $I_B$ in the two arms of the loop 21. The screening current $I_S(H)$ adapts itself such that the magnetic flux quantization condition in the loop 21 is satisfied. This yields a current of the entire structure that is periodic in the field H. See the following aforementioned references: A. Barone and G. Paterno, *Physics and Applications of the Josephson Effect*, John Wiley and Sons, New York, 1982; J. Clarke, *Poc. of IEEE* 77, 1208 (1989); M. Tinkham, *Introduction to Superconductivity*, Second Edition, McGraw-Hill, Inc., New York, 1996, pages 215 and 225.

The structure shown in FIG. 2 includes superconductor loop 21 and two conventional Josephson junctions, $JJ_{CO-1}$ and $JJ_{CO-2}$, which are at the core of a standard dc SQUID 20. Each convention Joshephson Junction $J_{CO}$ includes a buffer layer 22 and two superconductor loop banks $21_a$ and $21_b$, which sandwich buffer layer 22. Also shown in FIG. 2 are: the external field H; a representative conventional vortex magnetic field line $V_{CO}$; and, a representative self-field magnetic field line $h(I_B+I_S(H))$. Magnetic field line $h(I_B+I_S(H))$ is induced by the bias current $I_B$ and the $I_S(H)$ currents. Note that vortex $V_{CO}$ and induced magnetic field line $h(I_B+I_S(H))$ interfere with the external field H, which is the object of measurement. Still referring to FIG. 2, for practical reasons the bias current $I_B$ is chosen such that bias current $I_B$ is larger than current $I_c^{JJ}$ of the individual Josephson junction $JJ_{CO}$. Also for practical reasons, the two conventional Josephson junctions $JJ_{CO}$ are typically endowed with a small shunt resistance (not shown in FIG. 2) to avoid a hysteretic I-V. See the following aforementioned references: M. Tinkham, *Introduction to Superconductivity*, Second Edition, McGraw-Hill, Inc., New York, 1996, Chapter 6; A. Barone and G. Paterno, *Physics and Applications of the Josephson Effect*, John Wiley and Sons, New York, 1982; J. Clarke, *Poc. of IEEE* 77, 1208 (1989).

An important factor limiting the dc SQUID 20 sensitivity is the interference of flux noise with the probe-field (H) flux, regardless of how large is the transfer function (also known as the "gain"). The transfer function is defined as $V_\Phi=|(\partial V/\partial\Phi|)_{I_B}|$, where $\partial V\approx(\delta V)$ is the minimum resolvable voltage-variation in response to a minimum incurred flux-variation (i). In the dc SQUID geometry of FIG. 2, where H and $\{I_B, I_S(H)\}$ are perpendicularly aligned to each other, the induction of the superconductor loop 21 implies that fluctuations in currents flowing around the loop generate flux-fluctuations in the loop. This flux noise is indistinguishable from that of the probe field, and therefore limits the resolution of H. See the aforementioned M. Tinkham, *Introduction to Superconductivity*, Second Edition, McGraw-Hill, Inc., New York, 1996, pages 224-229; see also, e.g., D. Agassi, *Physica C* 371, 34 (2002), incorporated herein by reference; M. I. Faley et al. (7 authors), *App. Phys. Lett* 67, 2087 (1995), incorporated herein by reference; J. Clarke and R. H. Koch, *Science* 242, 217 (1988), incorporated herein by reference.

An unavoidable source of current fluctuations is thermal noise (also known as "Johnson noise" or "Nyquist noise"), which emanates from the single-electron current-component of $\{I_B, I_S(H)\}$. Another unavoidable source of flux noise is random vortex motion. See the following aforementioned references: M. Tinkham, *Introduction to Superconductivity*, Second Edition, McGraw-Hill, Inc., New York, 1996, pages 215 and 225; D. Agassi, *Physica C* 371, 34 (2002); M. I. Faley et al., *App. Phys. Lett.* 67, 2087 (1995); J. Clarke and R. H. Koch, *Science* 242, 217 (1988). Random vortex motion arises in the following manner. Part of the magnetic field threading through the superconductor loop 20 of FIG. 2 penetrates the loop 21 itself in the form of magnetic vortices $V_{CO}$, which are then subject to thermal activation. One such standard superconductor vortex $V_{CO}$ is shown in FIG. 2. As these vortices $V_{CO}$ hop randomly around, their associated magnetic field lines thread at random through the superconductor loop 21, thereby adding flux noise to the loop 21.

In real-world devices there is also flux noise from the ancillary structures in the SQUID, such as the "washer," which acts as a flux "antenna." See the following aforementioned references: A. Barone and G. Paterno, *Physics and Applications of the Josephson Effect*, John Wiley and Sons, New York, 1982; J. Clarke, *Poc. of IEEE* 77, 1208 (1989); D. Agassi, *Physica C* 371, 34 (2002); M. I. Faley et al., *App. Phys. Lett.* 67, 2087 (1995); J. Clarke and R. H. Koch, *Science* 242, 217 (1988). There is an enormous body of literature on ways to mitigate noise and on other design issues associated with the dc SQUID.

Figure 3:
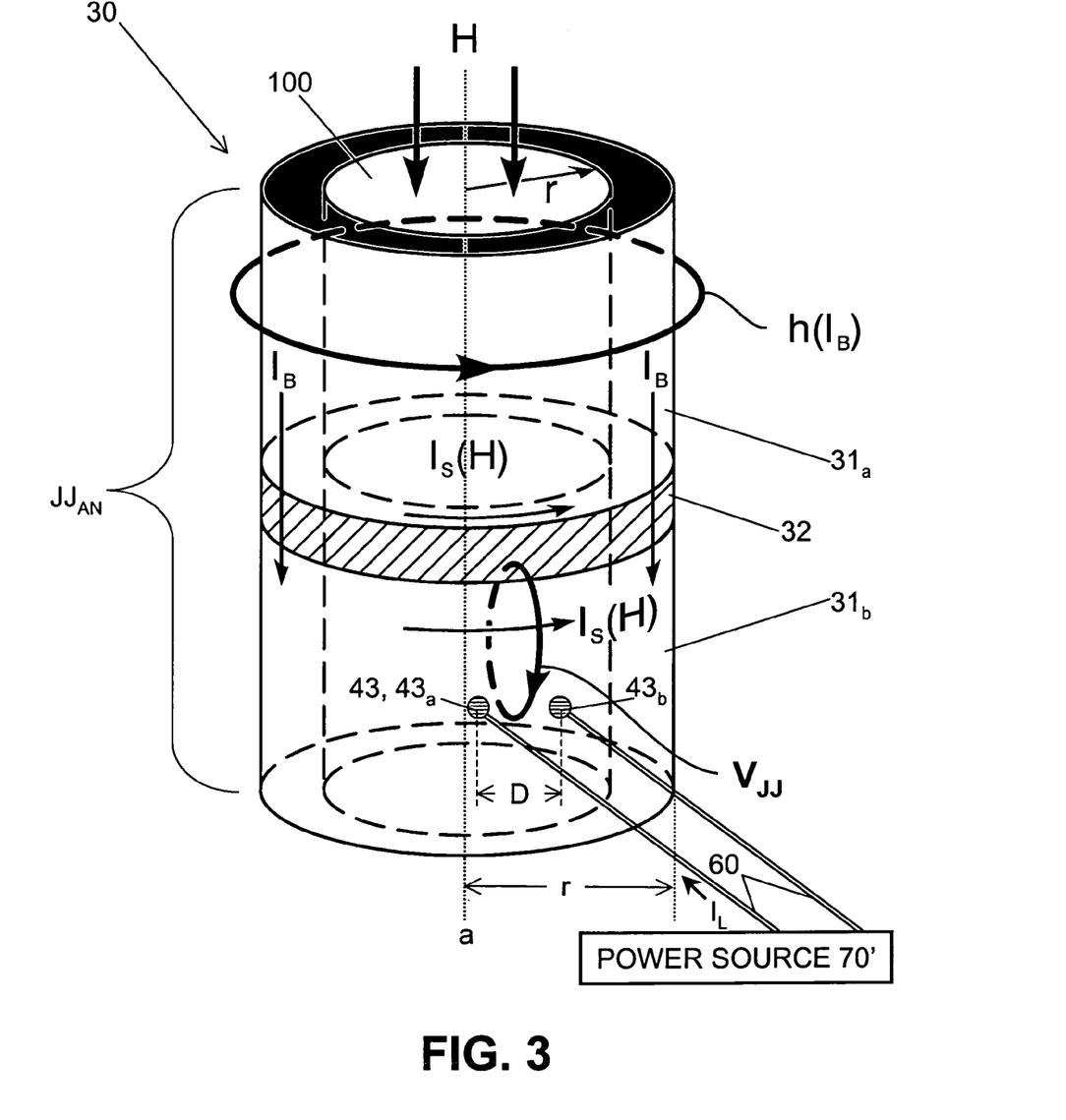
FIG. 3 is a perspective view of an embodiment of superconductivity-based magnetic sensing core structure in accordance with the present invention, particularly illustrating a single annular Josephson junction.
Figure 4:
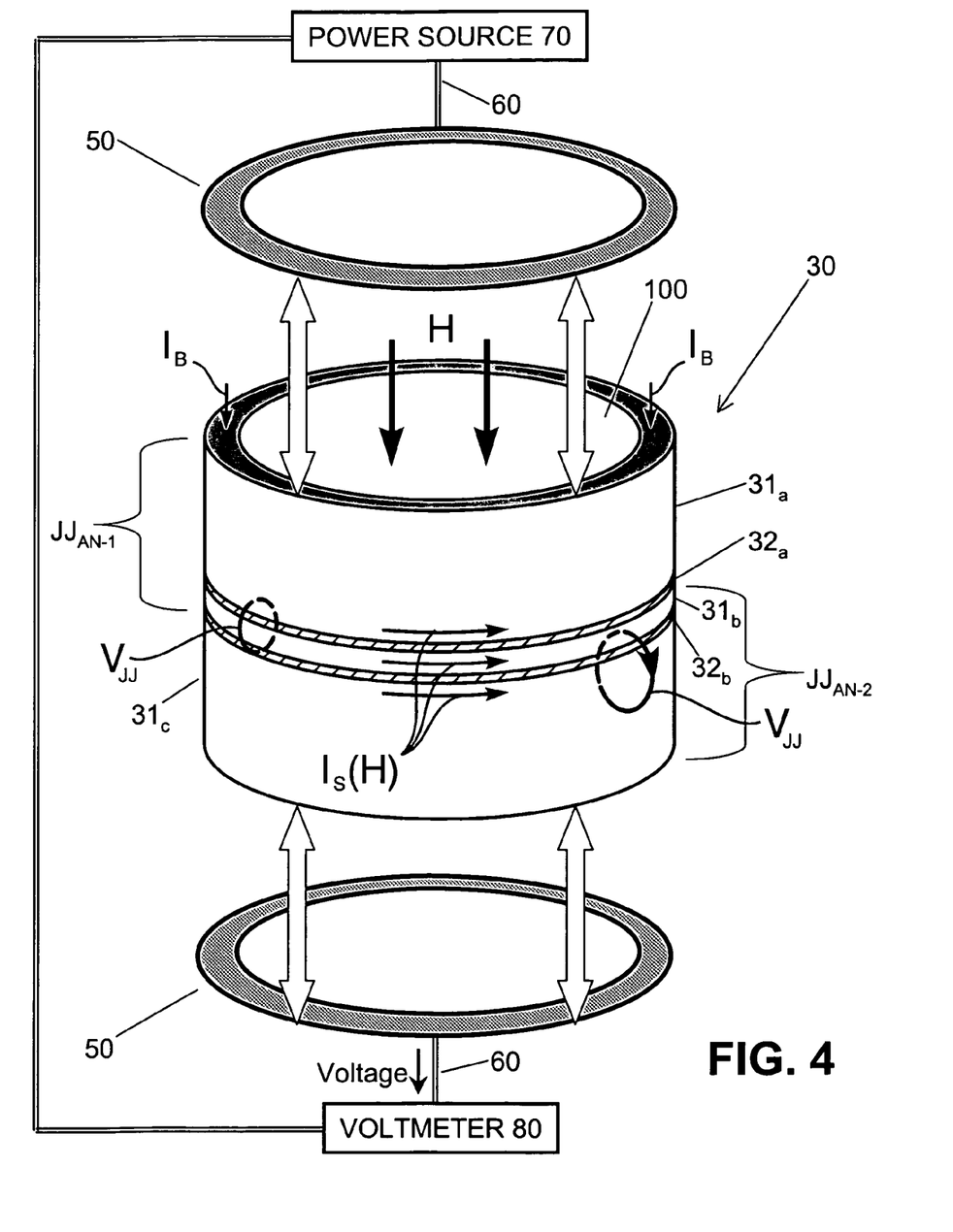
FIG. 4 is a perspective view of another inventive embodiment of superconductivity-based magnetic sensing core structure, particularly illustrating a stacking arrangement of two annular Josephson junctions.
Figure 5:
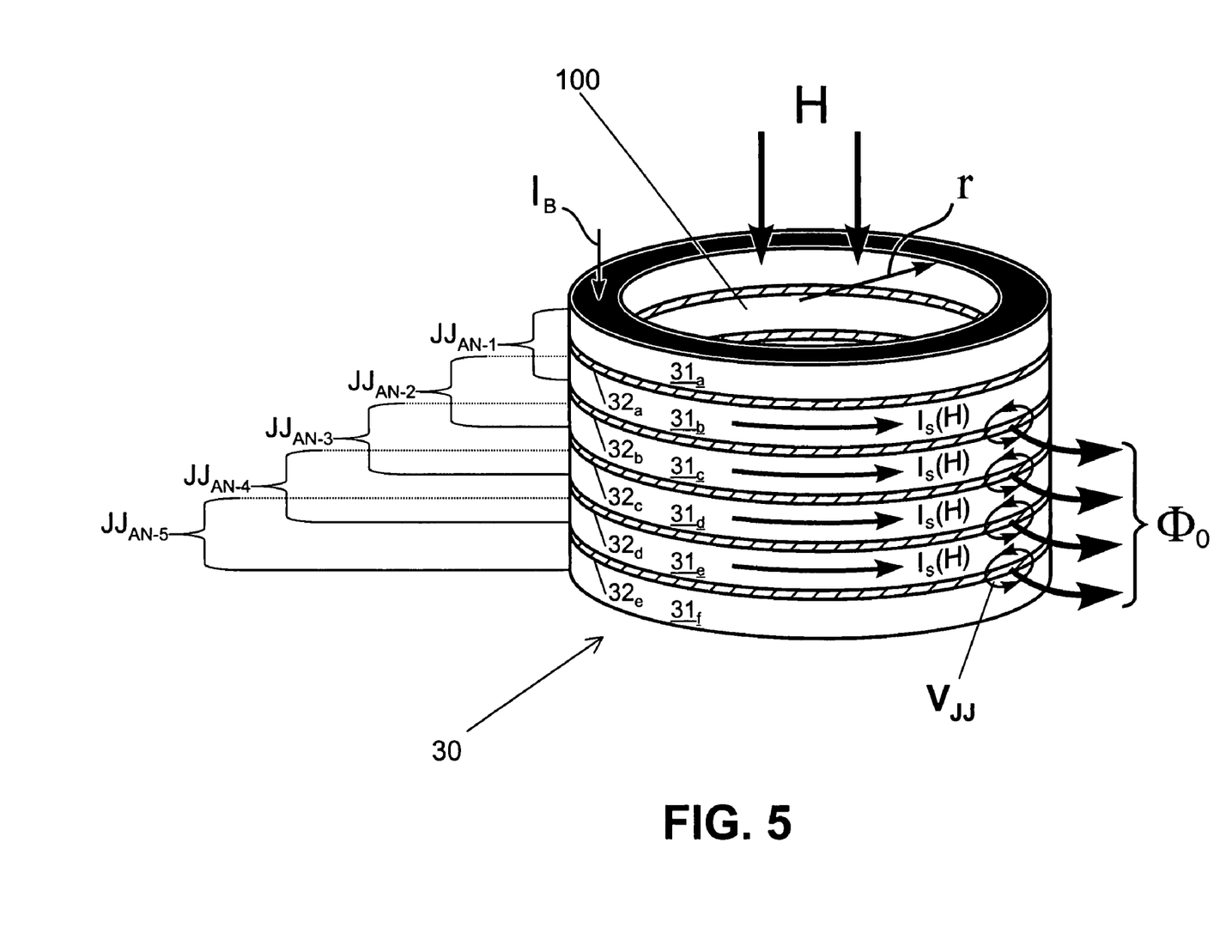
FIG. 5 is a perspective view of another inventive embodiment of superconductivity-based magnetic sensing core structure, particularly illustrating a stacking arrangement of five annular Josephson junctions and the insertion of magnetic vortices in the annular Josephson junctions.
Figure 6:
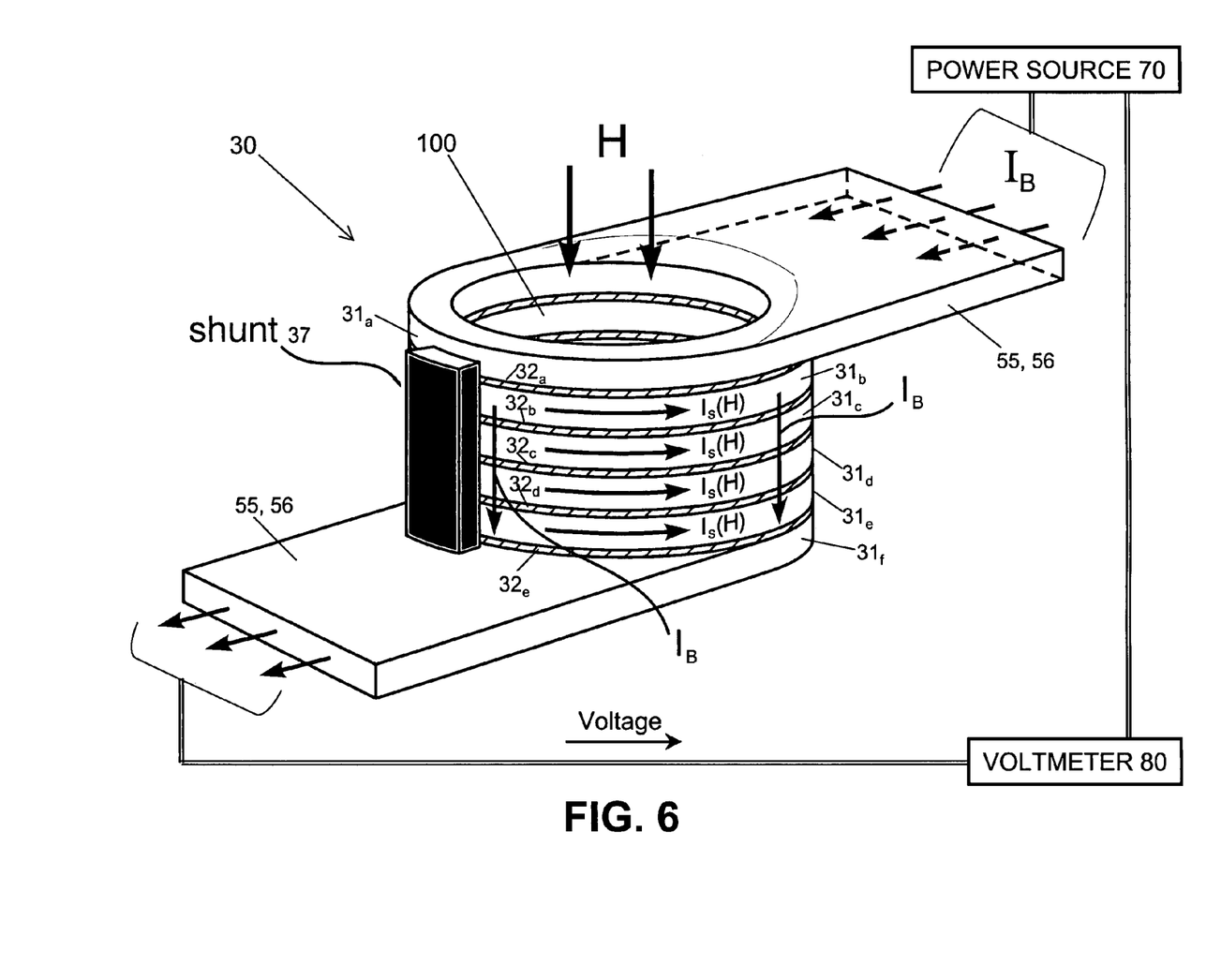
FIG. 6 is a perspective view of another inventive embodiment of superconductivity-based magnetic sensing core structure, particularly illustrating a stacking arrangement of five annular Josephson junctions and the connection of a shunt resistor across the annular Josephson junctions.

Reference now being made to FIG. 3, FIG. 4, FIG. 5 and FIG. 6, the present invention calls for one or more annular Josephson junctions $JJ_{AN}$, representing an alternative to the two-Josephson junction loop 20 at the core of a standard dc SQUID such as shown in FIG. 2. The present invention can be variously embodied as having a single Josephson junction, such as shown in FIG. 3, either in the presence of or the absence of one or more Josephson junction vortices. FIG. 4 through FIG. 6 show three examples of inventive "stacked" devices, viz., a two Josephson junction device without threaded Josephson junction vortices (FIG. 4), a five Josephson junction device with threaded Josephson junction vortices in all Josephson junctions (FIG. 5), and a five Josephson junction device with a shunt and without threaded Josephson junction vortices (FIG. 6). It is to be understood that the three main inventive features illustrated in FIG. 4 through FIG. 6—namely, (i) plurality of Josephson junctions, (ii) one or more Josephson junction vortices, and (iii) one or more shunts—can be inventively practiced in multifarious combinations and configurations, e.g., a Josephson junction stack without either a Josephson junction vortex or a shunt, a Josephson junction stack with a Josephson junction vortex but without a shunt, a Josephson junction stack with a shunt but without a Josephson junction vortex, etc.

Central to the present invention is its understanding that its new geometry, in which a SQUID structure is uniquely characterized by a hole (longitudinal bore) and one or more annular Josephson junctions, can alleviate the above-discussed flux noise problem that is inherent in the geometry of FIG. 2. According to inventive principles, generally, the measured magnetic field threads through the bore of the one or more annular Josephson junctions $JJ_{AN}$. The present invention effects a novel, concrete combination of two abstract concepts known in non-inventive superconductive contexts, viz., (a) cylindricalness (annularity) and (b) Josephson junction. The present invention uniquely and efficaciously blends the notion of cylindricalness/annularity of the Little-Parks configuration, shown in FIG. 1, with the notion of a Josephson junction in a conventional dc SQUID device, shown in FIG. 2.

In an annular Josephson junction $JJ_{AN}$ according to the present invention, an annular Josephson junction buffer layer (non-superconductive layer) 32 is sandwiched (one on each side) between two adjacent annular Josephson junction bank layers (superconductive layers) 31. Inventive core structure 30 shown in FIG. 3 through FIG. 6 and FIG. 8 each have a longitudinal hole 100 and a geometric longitudinal axis a. Hole 100 is the hollow (interior space) of inventive core structure 30. During typical operation of inventive apparatus, a portion of the magnetic field H of interest is present inside the hole 100 so as to be parallel to (aligned with) the longitudinal axis a. Generally less complicated inventive embodiments, particularly those that include a single annular Josephson junction $JJ_{AN}$, are exemplified in FIG. 3. Some inventive embodiments, such as illustrated in FIG. 4 through FIG. 6, provide for a "stack" of plural annular Josephson junctions $JJ_{CO}$ Whether single or stacked, each annular Josephson junction buffer layer (non-superconductive layer) 32 is sandwiched (one on each side) between two adjacent annular Josephson junction bank layers (superconductive layers) 31. Current leads 55 are shown in FIG. 6, and are readily envisioned to include the topmost and bottommost superconductor annuli 31, and extensions 56 thereto, in the inventive devices shown in FIG. 3 through FIG. 5. In inventive practice, the bias current should be chosen at or very close to a properly chosen voltage-discontinuity or high voltage derivation of the I-V curve of the inventive device. The superconductor material employed to make an inventive device can be any of the known superconductors.

With reference to FIG. 3, a single annular Josephson junction $JJ_{AN}$ includes an annular buffer layer 32 and two cylindrical superconductor banks 31 (viz., $31_a$ and $31_b$) having radius r. Shown in FIG. 3 are the currents and magnetic fields pertaining to the finite width superconductor cylinder banks 31 in the presence of an external magnetic field H and a bias current $I_B$. Also shown is a representative Josephson junction vortex $V_{JJ}$, which threads through the annular Josephson Junction $JJ_{AN}$—threading through a point in buffer layer 32 and through a point in one of the cylindrical superconductor banks 31. Further shown is a representative self-field magnetic field line $h(I_B)$ induced by the bias current $I_B$. Note that the vortex $V_{JJ}$ and the bias current-induced magnetic field $h(I_B)$ do not interfere with the external field H.

Still referring to FIG. 3, the periodic screening currents $I_S(H)$ and $I_B$ in this inventive configuration are aligned perpendicularly to each other so that just $I_B$, which is H-independent, crosses the annular Josephson junction $JJ_{AN}$. However, also in this inventive geometry, the H-periodic screening currents still affect the Josephson junction $JJ_{AN}$ for the same reason as for the Little Parks experiment discussed hereinabove, since the screening currents $I_S(H)$ vary the gap. See the aforementioned M. Tinkham, *Introduction to Superconductivity*, Second Edition, McGraw-Hill, Inc., New York, 1996, pages 123-124 and 128-130. The gap, in turn, determines the Josephson junction $JJ_{AN}$ critical-current $I_c^{JJ}$ (See the following aforementioned references: M. Tinkham, *Introduction to Superconductivity*, Second Edition, McGraw-Hill, Inc., New York, 1996, page 200; T. Van Duzer and C. W. Turner, *Principles of Superconductive Devices and Circuits*, Elsevier, N.Y., 1981, pages 208 and 218), which determines the I-V curve shape. The latter is probed by the bias current $I_B$.

A simple estimate of the ensuing voltage variation is rendered as follows. For the inventive cylinder shown in FIG. 3, one obtains $(\delta\Delta)/\Delta \sim (\xi/r)^2$, where $\xi$ denotes the coherence length and r is the radius of the hole. See the aforementioned M. Tinkham, *Introduction to Superconductivity*, Second Edition, McGraw-Hill, Inc., New York, 1996, pages 123-124 and 128-130. From the above, and from the aforementioned expression relating $I_c^{JJ}$ and the gap $\Delta$, it follows that $(\delta I_c^{JJ})R_N \approx (\delta\Delta)/|e|$ is an estimate for the periodic voltage-variation in the dissipative I-V curve domain (as in the dc-SQUID case). See the following aforementioned references: A. Barone and G. Paterno, *Physics and Applications of the Josephson Effect*, John Wiley and Sons, New York, 1982; J. Clarke, *Poc. of IEEE* 77, 1208 (1989); M. Tinkham, *Introduction to Superconductivity*, Second Edition, McGraw-Hill, Inc., New York, 1996, page 200, incorporated herein by reference; T. Van Duzer and C. W. Turner, *Principles of Superconductive Devices and Circuits*, Elsevier, N.Y., 1981, pages 208 and 218. For a representative high temperature superconductor (HTS) case with $\xi=2$ nm, $r=2$ μm, $\Delta=0.02$ eV, this estimate yields $(\delta I_c^{JJ})R_N \approx 20$ nV. Since standard voltage-measurement instrumentation can resolve voltages lower by 2-3 orders of magnitude than this estimate, voltage-variations for structures with the inventive geometry of FIG. 3 made of low temperature superconductors (LTS) such as Nb, or the recently discovered $MgB_2$ superconductor, are well within commercial measuring capabilities, therefore suggesting the viability of this inventive SQUID concept.

There is a second mode of coupling that can be inventively effected between $I_S(H)$ and the Josephson junction properties in the inventive geometry of FIG. 3, namely, the insertion of a vortex in the Josephson junction. A vortex whose core rests in the present invention's annular Josephson junction $JJ_{AN}$ buffer (barrier) layer 32 is referred to herein as a Josephson junction vortex $V_{JJ}$, as distinguished from what is referred to herein as a conventional superconductor vortex $V_{CO}$, the core of which is in the superconductor itself. See the following aforementioned references: M. Tinkham, *Introduction to Superconductivity*, Second Edition, McGraw-Hill, Inc., New York, 1996, Chapter 6; A. Barone and G. Paterno, *Physics and Applications of the Josephson Effect*, John Wiley and Sons, New York, 1982; J. Clarke, *Poc. of IEEE* 77, 1208 (1989).

Various methods and techniques have been known in non-inventive contexts for inserting a vortex. The first experiments involving a single vortex insertion employed a focused electron beam, a rather complicated device unsuitable for applications. See A. V. Ustinov, T. Doderer, R. P. Huebener, N. F. Pedersen, B. Mayer and V. A. Oboznov, *Phys. Rev. Lett.* 69, 1815 (1992), incorporated herein by reference. Later experiments, such as described by A. V. Ustinov, App. Phys. Lett. 80, 3153 (2002), incorporated herein by reference, involve a considerably simpler and more practical method that may be applied in the context of inventive practice, as elaborated upon in the next two paragraphs. This single vortex insertion method disclosed by Ustinov requires the attachment of two current leads for each one of, or for a group of, adjacent Josephson junctions. The leads mentioned in the next two paragraphs, used for vortex insertion in the present invention's Josephson junction(s), are ancillary to the present invention's core structures shown in FIG. 3 through FIG. 6.

Consider the case of one annular Josephson junction such as shown in FIG. 3, with two current leads 43 attached to one bank, bank $31_b$, perpendicular to the Josephson junction plane. The electrically conductive leads 43 are each connected to a power source 70' via wires 60, and are separated by a distance D. According to typical inventive practice, power sources 70 (shown in FIG. 4 and FIG. 6) and 70' (shown in FIG. 3) are different power sources. Now a current $I_L$ is injected through one of the two leads, lead $43_a$. Some of the current $I_L$ penetrates the adjacent Josephson junction bank $31_b$, circles back and is collected by the second lead $43_b$. However, some of the current penetrates the adjacent Josephson junction bank $31_a$ and crosses the Josephson junction buffer layer 32 so as to enter the opposite Josephson junction bank $31_a$, and then circles back to cross the Josephson junction buffer layer 32 for a second time to be collected by the second lead $43_b$. This semi-circular current flow pattern creates a local magnetic flux $\Phi_L$ in the region between the current-injection leads. As soon as this flux exceeds $\Phi_0$, the flux quantum, it is energetically favorable for the Josephson junction to compensate it with a vortex of flux $-\Phi_0$ such that its magnetic field opposes the self-field associated with $I_L$. By adjusting D and $I_L$ it is possible to ensure that only one such vortex $V_{JJ}$ is created. Once created, the vortex $V_{JJ}$ remains trapped while the current $I_L$ can be turned off.

This vortex insertion method can be extended to the case of an annular Josephson junction stack (i.e., a stack of two or more annular Josephson junctions), such as shown in FIG. 4 through FIG. 6. One such possible extension would be to attach two leads to each Josephson junction in the stack, each Josephson junction having its own pair of leads corresponding thereto. The separation between the current injection leads, the current level and injection direction will ensure vortex insertion in one Josephson junction only. Depending on simulations (which currently do not exist in the literature) it may be also possible to stock a plural (e.g., a few) Josephson junctions at one time, one vortex provided in each Josephson junction, by injecting a larger current that will penetrate a few adjacent Josephson junctions before circling back to be collected.

Reference is now made to FIG. 7A through FIG. 7D. As depicted schematically in FIG. 7A through FIG. 7D, a Josephson junction vortex consists of a circulating currents envelope $I_{VOR}^{(0)}$ (surrounding a vortex core) which is symmetrically distributed between the two Josephson junction banks 31 and is aligned perpendicularly to the cylinder axis a. As pointed out hereinabove, techniques for the insertion of such a Josephson junction vortex $V_{JJ}$ have been established in non-inventive contexts. See G. Hechtfischer, R. Kleiner, A. V. Ustinov and P. Miller, Phys. Rev. Lett. 79, 1365 (1997), incorporated herein by reference; A. V. Ustinov and S. Sakai, App. Phys. Lett. 73, 686 (1998), incorporated herein by reference.

Figures 7A, 7C:
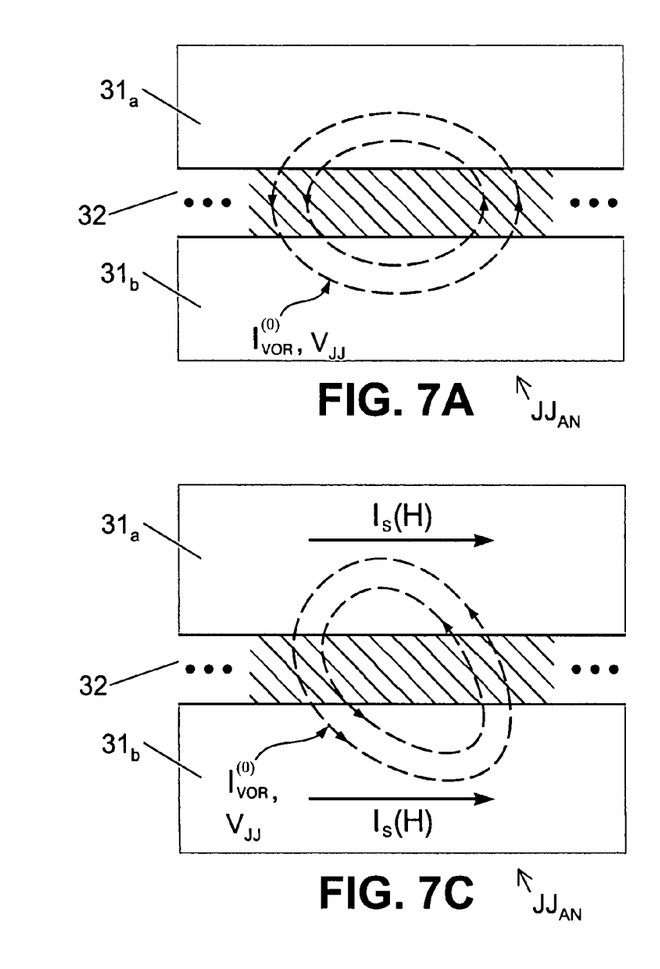
Figures 7B, 7D:
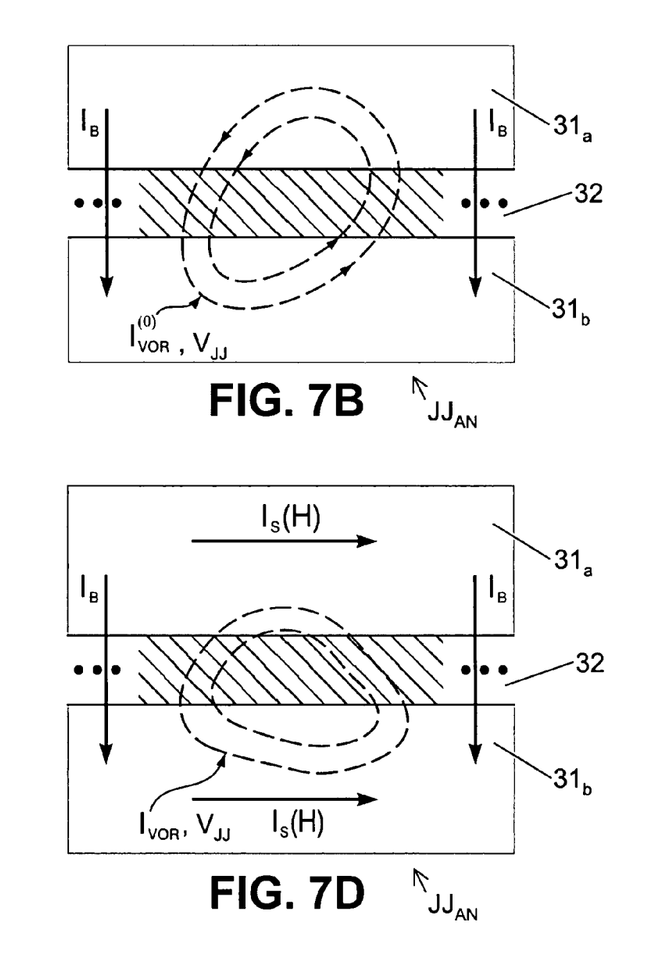

FIG. 7A through FIG. 7D illustrate a threaded vortex $V_{JJ}$ in a particular direction through an annular Josephson Junction $JJ_{AN}$ formed by two banks $31_a$ and $32_b$ and a buffer 32 therebetween. In Josephson Junction $JJ_{AN}$, superconductor banks 31 sandwich buffer 32. The distributed currents circulating the vortex's core are shown in FIG. 7A through FIG. 7D as thin, broken loops $I_{VOR}^{(0)}$. Vortex V, is shown in FIG. 7 in the presence of a bias current $I_B$. As shown in FIG. 7C and FIG. 7D, in the presence of an external field H, induced currents $I_S(H)$ are generated in both of the Josephson Junction banks 31. As shown in FIG. 7A, in the absence of both an external field H (having associated therewith external field induced currents $I_S(H)$ and a bias current $I_B$, currents loop $I_{VOR}^{(0)}$ is symmetrical between the two annular Josephson Junction banks 31.

FIG. 7B through FIG. 7D show the asymmetrical distortion of the vortex currents $I_{VOR}^{(0)}$, such distortion resulting from an external (measured) field and/or a bias current $I_B$. As shown in FIG. 7B through FIG. 7D, in the presence of either or both of an external field H (having associated therewith external field induced currents $I_S(H)$ and a bias current $I_B$, vortex currents loop $I_{VOR}^{(0)}$ is asymmetrical between the two annular Josephson Junction $JJ_{AN}$ banks 31. External field induced currents $I_S(H)$ and bias current $I_B$ can each independently interfere with the flow of the currents distribution $I_{VOR}^{(0)}$ that circulates the vortex $V_{JJ}$ core. The more pronounced distortion of vortex-currents distribution $I_{VOR}^{(0)}$, shown in FIG. 7D, results from the combined influences of external field induced currents $I_S(H)$ and bias current $I_B$. The distortion of $I_{VOR}^{(0)}$ depends on the external magnetic field H and the bias current $I_B$. The vortex motion round-and-round in the annular Josephson Junction $JJ_{AN}$ depends on the magnitude of the external field H, which causes distortion of the currents distribution $I_{VOR}^{(0)}$. This dependence is expected to be strong at "high" vortex angular velocities.

Thus, as shown in FIG. 7D, in the presence of H the screening currents $I_S(H)$ and the vortex circulating currents $I_{VOR}^{(0)}$ combine. This yields a circulating-currents envelope $I_{VOR}^{(0)}$ that is asymmetrically distributed between the two Josephson junction banks 31, as shown in FIG. 7D. The motion of such a distorted Josephson junction vortex $V_{JJ}$ as it circulates around the Josephson Junction annulus $J_{AN}$ under the drive of $I_B$ invokes different (most likely an increase in) dissipation than that of the undistorted vortex $V_{JJ}$ that is shown in FIG. 7A. This difference will be reflected in the corresponding I-V curve. Furthermore, since this type of vortex distortion is driven by a field-periodic effect, so will be its corresponding I-V curve. Notwithstanding the lack of quantitative calculations of this effect in the literature, it is plausible to expect that the presence of a Josephson junction vortex $V_{JJ}$ in the geometry of FIG. 3 will enhance the coupling of $I_S(H)$ to the corresponding I-V curve.

The advantage of the present invention's new geometry shown in FIG. 3, over the conventional dc SQUID geometry shown in FIG. 2, lies mainly in a partial reduction of the interference of flux noise, which compromises SQUID sensitivity. The magnetic field H and the bias current $I_B$ are parallel in the inventive configuration of FIG. 3, whereas in FIG. 2 the magnetic field H and the bias current $I_B$ are perpendicularly aligned. Consequently, according to inventive principle, magnetic field lines associated with noise in $I_B$ (e.g., Johnson noise) do not interfere with those associated with those of H, and hence this noise source is inhibited from interfering with the measured probe-field flux.

Furthermore, still referring to the present invention's embodiment shown in FIG. 3 (which includes a single annular Josephson junction $JJ_{AN}$), noise generated by random motion of vortices that nucleated in the cylinder's envelope, and thermal noise from $I_S(H)$, are partly reduced as a result of the presence of the annular Josephson junction. This follows since, in the annular Josephson junction $JJ_{AN}$, the Josephson junction buffer layer 32 interrupts the continuity of the cylinder's envelope; therefore, as illustrated by vortex $V_{JJ}$ in FIG. 3, magnetic field lines associated with vortices $V_{JJ}$ and $I_S(H)$ can "leak out" through it and hence avoid, in part, interference with the magnetic filed lines of H. This type of noise interference reduction is further amplified in the present invention's annular Josephson junction stack geometries further discussed hereinbelow with reference to FIG. 4 through FIG. 6.

FIG. 3 depicts an inventive dc or ac SQUID embodiment that includes a single annular Josephson junction $JJ_{AN}$. In contrast, FIG. 4, FIG. 5 and FIG. 6 depict inventive dc SQUID embodiments that include plural annular Josephson junctions $JJ_{AN}$. The term "stack," as used herein in association with inventive practice of annular Josephson junctions, refers to any plural number (i.e., two or more) of annular Josephson junctions that are arranged or configured in an orderly fashion, contiguously or separately, one above the other. According to typical inventive embodiments, the plural ("stacked") annular Josephson junctions lie in geometric planes that are parallel to each other. Further, according to typical inventive embodiments, the annular Josephson junctions define same or similar geometric ring (annular) shapes that are coaxial with each other, and that are coincident and coaxial with the cylindrical shape defined by the superconductor portion of the inventive device.

As discussed hereinabove with reference to FIG. 3, there are two basic coupling modes of the Josephson junction and $I_S(H)$ in the present invention's single annular Josephson junction geometry, which is thus advantageous (versus the standard SQUID geometry shown in FIG. 2) in terms of noise reduction. Some embodiments of the present invention, such as shown in FIG. 4 through FIG. 6, enhance this quality of noise reduction by augmenting the number of annular Josephson junctions to two or more. These inventive "stack" embodiments include a stack of annular Josephson junctions, and can either include or exclude insertion of one or more Josephson junction vortices. This augmentation brings in additional physical phenomena that may enhance sensitivity even further through increase of the pertinent transfer-function $V_\Phi$, as well as through further reduction in flux noise interference.

As shown in FIG. 4, a second parallel annular Josephson junction $JJ_{AN}$ is added to the geometry shown in FIG. 3. Thus, inventive device 30 shown in FIG. 4 includes a first annular Josephson junction $JJ_{AN-1}$ and a second annular Josephson junction $JJ_{AN-2}$. Annular Josephson junction $JJ_{AN-1}$ is formed by superconductor banks $31_a$ and $31_b$ and buffer $32_a$ therebetween; annular Josephson junction $JJ_{AN-2}$ is formed by superconductor banks $31_b$ and $31_c$ and buffer $32_b$ therebetween. FIG. 4 can be considered without or with the insertion of one or more Josephson junction vortices $V_{JJ}$, similarly as the present invention's basic configuration shown in FIG. 3 can be considered without or with the insertion of one or more Josephson junction vortices. Considering FIG. 4 as not including insertion of Josephson junction vortices, in terms of noise reduction the same advantages pertaining to FIG. 3 apply, viz., the removal of flux-noise associated with $I_B$ and the reduction of flux noise interference emanating from $I_S(H)$ and vortex noise. Regarding flux noise interference, the second annular Josephson junction $JJ_{AN}$ yields further reductions in noise interference, since the two Josephson junctions in the structure introduce two disruptions in the cylinder's superconductor envelope. Consequently, the magnetic-field loops associated with vortices which nucleate in the cylinder's envelope and with the screening currents $I_S(H)$ have two venues to "leak out" through these cylinder breaks, as indicated in FIG. 4. This reasoning implies that the interference reduction of both noise sources increases with the number of annular Josephson junctions $JJ_{AN}$ in the stack, thereby enhancing further the sensitivity of the device.

Inventive devices 30 shown in FIG. 5 and FIG. 6 each include a first annular Josephson junction $JJ_{AN-1}$, a second annular Josephson junction $JJ_{AN-2}$, a third annular Josephson junction $JJ_{AN-3}$, a fourth annular Josephson junction $JJ_{AN-4}$, and a fifth annular Josephson junction $JJ_{AN-5}$. Annular Josephson junction $JJ_{AN-1}$ is formed by superconductor banks $31_a$ and $31_b$ and buffer $32_a$ therebetween; annular Josephson junction $JJ_{AN-2}$ is formed by superconductor banks $31_b$ and $31_c$ and buffer $32_b$ therebetween; annular Josephson junction $JJ_{AN-3}$ is formed by superconductor banks $31_c$ and $31_d$ and buffer $32_c$ therebetween; annular Josephson junction $JJ_{AN-4}$ is formed by superconductor banks $31_d$ and $31_e$ and buffer $32_d$ therebetween; annular Josephson junction $JJ_{AN-5}$ is formed by superconductor banks $31_e$ and $31_f$ and buffer $32_e$ therebetween.

FIG. 5 illustrates the present invention's insertion of plural Josephson junction vortices $V_{JJ}$ in a Josephson junction $JJ_{AN}$ stack structure, wherein the Josephson junction vortices $V_{JJ}$ act in concert so as to promote Cherenkov radiation. The inventive configuration shown in FIG. 5 invokes a new phenomenon, i.e., Cherenkov radiation associated with a "fast" rotating Josephson junction vortex. See the following aforementioned references: G. Hechtfischer, R. Keiner, A. V. Ustinov and P. Miller, *Phys. Rev. Lett.* 79, 1365 (1997); A. V. Ustinov and S. Sakai, *App. Phys. Lett.* 73, 686 (1998); see also, 1. Iguchi et al. (6 authors), *Jour. of Low Temp.* 117, 617 (1999), incorporated herein by reference.

Cherenkov radiation can be thought of as the electromagnetic counterpart of a sonic "boom," which occurs when the radiation-source velocity (e.g., of a supersonic plane) is higher than the acoustic radiation phase-velocity it emits. A Josephson junction vortex $V_{JJ}$ entails a charge-cloud, such as shown in FIG. 7A; hence, as the vortex $V_{JJ}$ moves, it radiates. In an annular Josephson junction $JJ_{AN}$ of the present invention, the Josephson junction vortex $V_{JJ}$ is endowed with a velocity by passing the perpendicularly flowing current $I_B$ through by virtue of the Lorentz force associated with $I_B$ and the vortex. See the aforementioned references: G. Hechtfischer, R. Keiner, A. V. Ustinov and P. Miller, *Phys. Rev. Lett.* 79, 1365 (1997); A. V. Ustinov and S. Sakai, *App. Phys. Lett.* 73, 686 (1998). Now, since the electromagnetic phase-velocity in the Josephson junction buffer layer is considerably smaller than its free space value (See the aforementioned M. Tinkham, *Introduction to Superconductivity*, Second Edition, McGraw-Hill, Inc., New York, 1996, page 222), for a sufficiently high vortex velocity Cherenkov radiation ensues when the rotating vortex "outruns" its own radiation.

It can be shown that, for a single Josephson junction and a single vortex, the condition for Cherenkov radiation cannot occur. However, for a stack of Josephson junctions (i.e., two or more Josephson junctions), simulations and experiments verified that such a radiation exists. See, e.g., E. Goldobin, A. Wallraff, N. Thyssen and A. V. Ustinov, *Phys. Rev. B* 57, 130 (1998), incorporated herein by reference. The heuristic origin for this is that for a Josephson junction stack, some of its radiation modes are sufficiently slow to be outrun by a rotating vortex subject to a sufficiently large $I_B$. These "slow" modes are collective in nature, involving the (non-trivial) interaction of all of the Josephson junctions in the stack. For example, in an inventive configuration wherein each Josephson junction $JJ_{AN}$ is endowed with a vortex $V_{JJ}$, such as shown in FIG. 5, for a bias current $I_B$ and radiation mode such that all vortices $V_{JJ}$ move in concert, the emitted radiation line is particularly sharp. See M. Tachiki and M. Machida, *Physica C* 341-348, 1493 (2000), incorporated herein by reference; M. Machida, T. Koyama, A. Tanaka and M. Tachiki, *Physica C* 331, 85 (2000), incorporated herein by reference; M. Machida, T. Koyama and M. Tachiki, *Phys. Rev. Lett.* 83, 4618 (1999), incorporated herein by reference. The onset of Cherenkov radiation is reflected in "kinks" and/or discontinuities in the I-V curve. See the aforementioned E. Goldobin, A. Wallraff, N. Thyssen and A. V. Ustinov, *Phys. Rev. B* 57, 130 (1998). Therefore, for a bias current chosen at the location of such a kink and/or discontinuity, the corresponding transfer function is greatly enhanced.

FIG. 6 illustrates other embodiments of the present invention's annular Josephson junction stack geometry, wherein one or more shunts are added across the individual Josephson junctions. As shown in FIG. 6, a shunt 37 connects the five Josephson junctions. A standard dc SQUID typically has shunt resistors to prevent hystereses in the current-voltage characteristics; that is, the addition of shunts is commonly used for a conventional dc SQUID configuration such as shown FIG. 2 to avoid a hysteretic I-V curve that is detrimental to given applications. Notwithstanding the lack of work I-V curves pertaining to the inventive annular Josephson junction configuration, it is inferred that a shunt 37 such as shown in FIG. 6 would be beneficial to the to the inventive annular Josephson junction configuration based on same or similar principle as has been demonstrated for conventional dc SQUIDS.

The inventive SQUID circuitry shown in FIG. 4 and FIG. 6 is generally representative of inventive practice. In a typical inventive SQUID core structure 30, electrons tunneling through each Josephson junction $JJ_{AN}$ (in particular, the corresponding buffer layer 32) manifest quantum interference, which varies in accordance with the strength of the magnetic field being measured, viz., magnetic field H. Inventive device 30 thus manifests a resistance in response to small changes in external magnetic field H. These small changes are inventively detected (using voltmeter 80) based on the voltage of the bias current $I_B$ that exits inventive core structure 30. The voltage is therefore indicative of the magnetic field H, since the voltage equals the product of the resistance and the current $I_B$, and since the resistance corresponds to the magnetic field H.

As shown in FIG. 4, associated with the inventive core structure 30 are two electrically conductive electrodes 50, electrically conductive wire 60, a power source (e.g., battery) 70, and a voltmeter 80. Similar inventive circuitry is shown in FIG. 6, except that in FIG. 6 the wires 60 connect directly to the superconductor annular ends of the inventive core structure 30. As shown in FIG. 6, the extreme annular superconductor banks 31, viz., banks $31_a$ and $31_f$, are each united with a superconductor lead 55, a curvilinear superconductor structure that facilitates connection to wire(s) 60. Thus, at opposite axial ends of inventive device 30, an integral superconductive piece 56 is formed by the combination of a bank 31 and a lead 55. Regardless of whether an electrode 50 or a lead 55 or some other means is used for imparting electrical current $I_B$ to the inventive core structure 30, a usual inventive requirement is that the electrical current $I_B$ that is conducted longitudinally (in the direction of axis a) through the inventive core structure 30 be uniformly distributed around the circumference of the inventive core structure 30.

Notable is the fact that the high temperature superconductor BSCCO (=$Bi_2Sr_2CaCu_2O_{8+1}$) has a layered crystal structure which, in effect, is a densely-packed Josephson junction stack consisting of "'metallic'" Cu—O layers (about 0.3 nm thick) intertwined with "dielectric" slabs composed of the other atoms in the unit cell (about 1.2 nm thick). See the following aforementioned references: M. Tachiki and M. Machida, *Physica C* 341-348, 1493 (2000); M. Machida, T. Koyama, A. Tanaka and M. Tachiki, *Physica C* 331, 85 (2000); M. Machida, T. Koyama and M. Tachiki, *Phys. Rev. Lett.* 83, 4618 (1999). One method to excite collective excitations of this "natural" Josephson junction stack is by threading vortices in parallel to the Cu—O layers and moving them with the bias current flowing perpendicularly to the Cu—O layers. Accordingly, a possible inventive approach that takes advantage of this nature-given structure is to use a single BSCCO and bore a hole in it. In inventive practice, a possible disadvantage of using natural structures such as BSCCO, as compared with using artificial structures such as described elsewhere herein, lies in the lack of control over the stack parameters (e.g., the thicknesses of the banks of the annular Josephson junctions) of the natural structures. In contrast, in artificial structures there is a large parameter space for design optimization.

The present invention features an annular Josephson junction configuration (e.g., an annular Josephson junction stack configuration) that can serve as a basis for a high sensitivity magnetometer or another, related device such as a gradiometer. In inventive practice, the shape of the annular hole is unimportant. Certain operation principles underlying the present invention's new dc SQUID geometry are the same as those underlying the well established dc SQUID (such as depicted in FIG. 2). See the following aforementioned references: A. Barone and G. Paterno, *Physics and Applications of the Josephson Effect*, John Wiley and Sons, New York, 1982; J. Clarke, *Proc. of IEEE* 77, 1208 (1989). A major advantage of the present invention's new geometry is interference reduction of some of the omnipresent flux noise sources with the flux of the probed field H. The superconductor material for making the inventive structure can be any superconductor, for instance, the following: (i) a low temperature superconductor material such as Nb, operating at a low temperature T=4.2K; or, a medium temperature superconductor material such as $MgB_2$, operating at medium temperatures T=20K-30K; or, a high temperature superconductor material such as liquid nitrogen, operating under a coolant at a high temperature T=77K.

According to typical inventive practice, the probe field is aligned along the axis of the bore, and the whole inventive structure is subject to a bias current $I_B$, which flows in parallel to the probe field. The bias current $I_B$ is judiciously chosen in accordance with details of the I-V curve to maximize the transfer function. It is customary in conventional dc SQUIDS to choose $I_B$ to be larger than the Josephson Junction critical current to avoid a hysteretic I-V curve. A similar choice can be made in practicing the present invention. Of particular note, in practicing an inventive embodiment that invokes Cherenkov radiation, $I_B$ can be chosen to be close to a discontinuous-feature in the I-V curve. See the following aforementioned references: I. Iguchi et al., *Jour. of Low Temp.* 117, 617 (1999); E. Goldobin, A. Wallraff, N. Thyssen and A. V. Ustinov, *Phys. Rev. B* 57, 130 (1998). In the absence of quantitative simulations and experimental work on the inventive configurations, the present invention's principle for choosing the "best" bias current in inventive practice should be the same principle as that for a conventional dc SQUID (See the aforementioned references: A. Barone and G. Paterno, *Physics and Applications of the Josephson Effect*, John Wiley and Sons, New York, 1982; J. Clarke, *Poc. of IEEE* 77, 1208 (1989)), which is that the H-field I-V curve modulations are to be maximized.

With regard to inventive "stack" embodiments, fabrication of the present invention's annular Josephson junction stack depends upon the selected superconductor material. For a low temperature superconductor with a well-developed deposition and Josephson junction technology, such as Nb, planar Josephson junction structures are available commercially (e.g., from HYPRES, Inc., 175 Clearbrook Road, Elmsford, N.Y. 10523; URL http://www.hypres.com). The corresponding technologies for $MgB_2$ and HTS materials are currently in the stage of being developed. See H. B. Wang, P. H. Wu, J. Chen, K. Maeda and T. Yamashita, *App. Phys. Lett.* 80, 1604 (2002), incorporated herein by reference; Y. J. Doh, H. J. Lee and H. S. Chang, *Phys. Rev. B* 61, 3620 (2000), incorporated herein by reference. It can be stated, however, that the known methods employed in shaping planar Josephson junction stacks such as photolithography, ion-milling and etching can be also used to make the present invention's annular Josephson junction stacks, given that the precise shape of the bore is unimportant.

Other design parameters of the inventive stack, such as dimensions, diameter, thickness and number of Josephson junctions, can, in theory, be optimized by generally following the paradigm of a large body of literature on the conventional dc SQUID. See the following aforementioned references: J. C. Gallop, *SQUIDs, the Josephson Effects and Superconducting Electronics*, Adam Hilger, Bristol, 1991, page 34; D. Koelle, R. Kleiner, F. Ludwig, E. Dankster and J. Clarke, *Rev. Mod. Phys.* 71, 631 (1999). Such theoretical calculations do not exist at present for the present invention. The present invention's annular Josephson junction stack geometry represents a core structural configuration for a dc squid, and typical inventive practice requires one or more additional parts or components. For instance, all standard ancillary structures employed to enhance conventional SQUID sensitivity, such as a washer and signal-processing electronics to suppress some types of noise (See the following aforementioned references: A. Barone and G. Paterno, *Physics and Applications of the Josephson Effect*, John Wiley and Sons, New York, 1982; J. Clarke, *Proc. of IEEE* 77, 1208 (1989)), should be applied for the present invention's new geometry, as well. A large leeway is afforded in optimizing the inventive device, given the totality of the choices for selecting and adjusting the inventive stack geometry parameters, including the following: (i) the number of annular Josephson junctions; the radius (radii) of the annular Josephson junction(s); (iii) the number and situation of inserted vortices, if any; (iv) the number and situation of incorporated shunts, if any; (v) the superconductor material(s).

As compared with conventional dc SQUIDS (such as illustrated in FIG. 2), the key advancement of the present invention's new configuration (such as shown in FIG. 3 through FIG. 6) is its enhanced sensitivity. The present invention's enhanced sensitivity is primarily due to the inhibition of inherent flux noises, such as thermal current noise and vortex random motion noise, from interfering with the probe field flux. These benefits are important consequences of the present invention's new geometry. Nevertheless, it is still necessary to ensure that the intrinsic Johnson voltage noise level in the inventive device is substantially smaller than the voltage variation induced by the probe-field flux periodicity. The estimate set forth in the following paragraph vindicates that measured voltage variations are considerably larger than the intrinsic Johnson voltage noise level.

The classical expression for the Johnson voltage noise is $\langle(\delta V)^2\rangle = 4 k_B T R(\delta f)$, where R is the shunt resistance, T is the temperature and $(\delta f)$ is the unit frequency (band width). See J. C. Gallop, *SQUIDs, the Josephson Effects and Superconducting Electronics*, Adam Hilger, Bristol, 1991, incorporated herein by reference, page 34. Comparing this voltage noise level to the voltage variation resulting from flow of screening currents, $(\delta I_c^{JJ})R_N \approx (\delta\Delta)/|e|$ for representative values R=1 Ohm, T=70K, $(\delta f)$=1 Hz, and the worst-scenario $(\delta\Delta)$ values estimates above yield the ratio $\sqrt{\langle(\delta V)^2\rangle}/(\delta\Delta) \sim 10^{-3}$. Noise emanating from the SQUID ancillary structures, such as the pick-up coil, is still present for the present invention's new geometry. Inventive practice can avail itself of current SQUID design ideas for minimizing noise, such as employing narrow lines and/or "antidots" (See the aforementioned D. Koelle, R. Kleiner, F. Ludwig, E. Dankster and J. Clarke, *Rev. Mod. Phys.* 71, 631 (1999)).

Another figure-of-merit for sensitivity pertaining to the present invention's new annular stack geometry is the transfer $V_\Phi$. Typically, for conventional dc SQUIDs, $V_\Phi \approx 10$-$100$ $\mu V/\Phi_0$, where $(\delta V)$ is on the order of $100 \mu V$ (See the following aforementioned references: D. Agassi, *Physica C* 371, 34 (2002); M. I. Faley et al. (7 authors), *App. Phys. Lett.* 67, 2087 (1995); J. Clarke and R. H. Koch, *Science* 242, 217 (1988)) and $(\delta\Phi)$ is on the order of $0.1\Phi_0$. In the present invention's new geometry the transfer function depends strongly on details such as the coupling mode between the screening and bias currents (namely, the presence or absence of inserted vortices), the chosen bias current point, the shunt or lack thereof in the stack, etc. In the absence of numerical simulations for the inventive annular Josephson junction stack geometry, the transfer function can be only inferred, with a degree of uncertainty.

One such source for inference of the transfer function is the observed voltage discontinuities in the I-V curve of a BSSCO crystal (See the aforementioned Iguchi et al., *Jour. of Low Temp.* 117, 617 (1999)), which acts as a stack of about 10,000 Josephson junctions. The discontinuities—some of which are associated with onset of Cherenkov radiation—are on the order of $(\delta V) \sim 0.1V$. A similar figure is obtained from an estimate of the voltage drop across each "elemental" Josephson junction in BSCCO, which is around 10 mV. Taking the crude assumption that in a shunted stack all of these voltage drops add up (See A. Yurgens, D. Winkler, T. Claeson, S. Ono and Y. Ando, *Phys. Rev. Lett.* 90, 147005-1 (2003), incorporated herein by reference; H. B. Wang et al. (6 authors), *App. Phys. Lett.* 77, 1017 (2000), incorporated herein by reference), and the number of such intrinsic Josephson junctions is about 1,000, an estimate of $(\delta V)$ is yielded on the order of 0.1V or even larger. Assuming all other factors contributing to the present invention's dc SQUID sensitivity being equal, this implies a potential $V_\Phi$ enhancement by a factor of about 100 times larger than for a conventional dc SQUID.

Another advantage of the present invention's new SQUID geometry is the flexibility to control the I-V non-linearity. In a conventional dc SQUID, the underlying non-linearity in the I-V curve is that of a single Josephson junction, which is determined by its material composition. In the present invention's new configuration, the I-V non-linearity can be "designed" by the selection of factors/parameters including the superconductor material, the stack characteristics (e.g., the number of Josephson junctions in the stack, the spacing between the Josephson junctions), the shunting of the Josephson junctions (e.g., the stack shunting schemes), the vortex content of the Josephson junctions (e.g., the number of threaded vortices), etc. These and other factors yield a wide range of possibilities for optimizing the present invention's new SQUID design. Great flexibility for optimizing the inventive SQUID design is afforded through variation of these and other parameters specifying the inventive structures.

Figure 8:
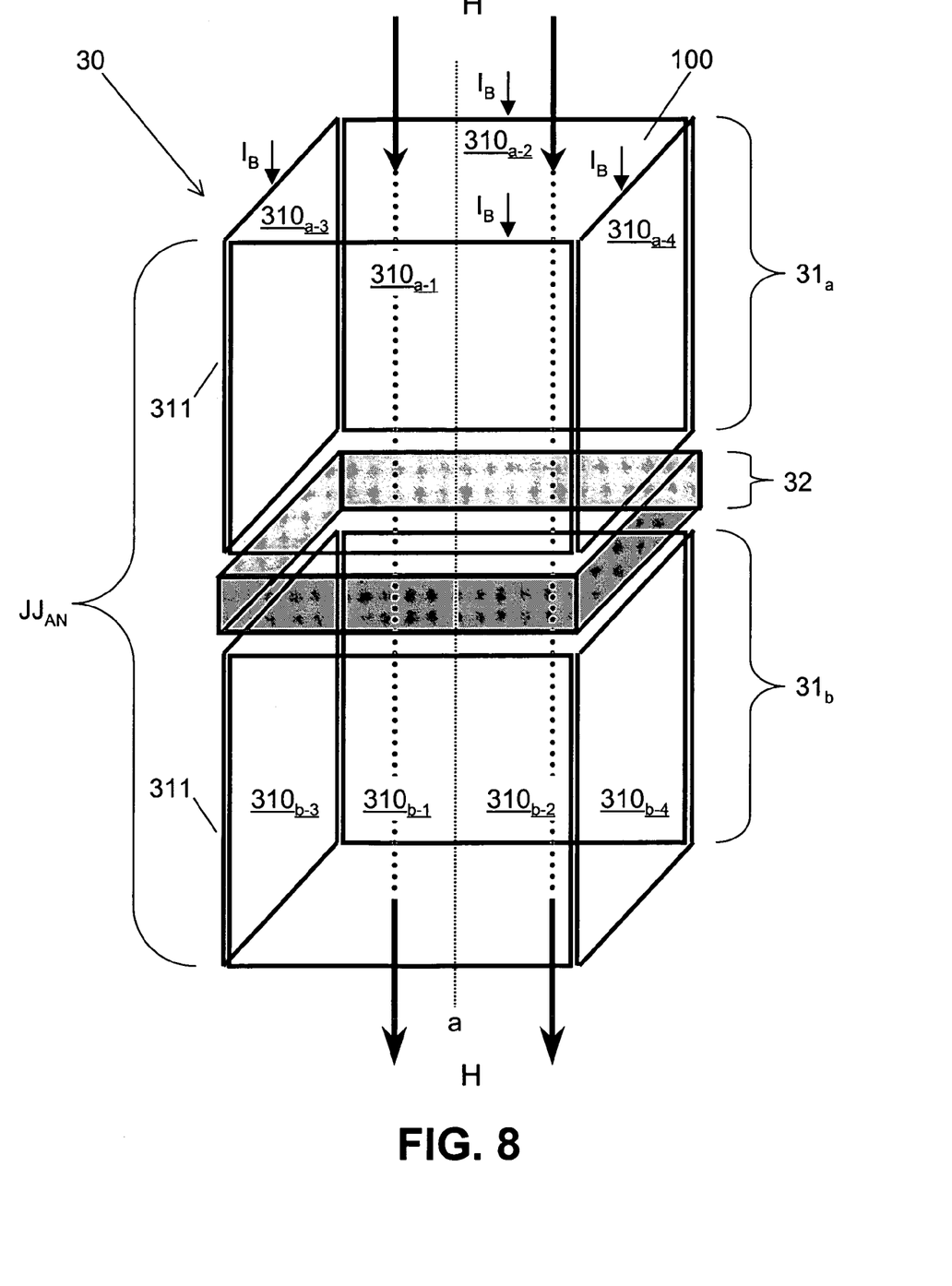
FIG. 8 is a perspective view, similar to the view shown in FIG. 3, of another embodiment of superconductivity-based magnetic sensing core structure in accordance with the present invention, particularly illustrating a single annular Josephson junction describing a rectangular prismatic shape, the annular Josephson junction being formed by two sets of four adjacently joined a-axis HTS thin-film lateral faces and a non-superconductive rectangular buffer layer therebetween.

According to typical inventive practice, an inventive annular Josephson junction device can be made by various inventive methods, such as including: (i) stacking, in alternating fashion, two or more annular c-axis superconductor structures (serving as Josephson junction banks) and one or more non-superconductor material structures (serving as Josephson junction buffer layers); or, (ii) shaping (e.g., machining) a single piece of single crystal superconductor material that is naturally characterized by alternation of non-superconductor buffer layers and superconductor banks; or, with reference to FIG. 8, (iii) constructing an edifice in which each annular superconductor bank unites at least three planar a-axis superconductor structures that are joined together along their longitudinal-axial edges so as to constitute lateral faces or sides of a three-dimensional geometric cylindric object. FIG. 8 illustrates an inventive embodiment that is similar to that shown in FIG. 3, particularly insofar as including a single Josephson junction $JJ_{AN}$. The inventive device 30 shown in FIG. 8 is a specialized version of the more generally representative inventive device 30 shown in FIG. 3.

As illustrated in FIG. 8, the single annular Josephson junction $JJ_{AN}$, which includes two superconductive banks 31a and 31b and a buffer layer 32 therebetween, defines the lateral sides of a rectangular geometric prism. Superconductor bank $31_a$ includes four planar structures composed of a-axis high temperature superconductor thin film, viz., superconductor faces (sides) $310_{a-1}$, $310_{a-2}$, $310_{a-3}$ and $310_{a-4}$; similarly, superconductor bank 31b includes four planar structures composed of a-axis high temperature superconductor thin film, viz., superconductor faces (sides) $310_{b-1}$, $310_{b-2}$, $310_{b-3}$ and $310_{b-4}$. Geometrically speaking, faces $310_{a-1}$ and $310_{b-1}$ are coplanar; faces $310_{a-2}$ and $310_{b-2}$ are coplanar; faces $310_{a-3}$ and $310_{b-3}$ are coplanar; faces $310_{a-4}$ and $310_{b-4}$ are coplanar; faces $310_{a-1}$ and $310_{a-2}$ are parallel; faces $310_{a-3}$ and $310_{a-4}$ are parallel; faces $310_{b-1}$ and $310_{b-2}$ are parallel; faces $310_{b-3}$ and $310_{b-4}$ are parallel; superconductor banks $31_a$ and $31_b$ and buffer layer 32 share geometric longitudinal axis a; superconductor banks $31_a$ and $31_b$ and buffer layer 32 are transversely congruent, each describing the same rectangle in cross-section. The various geometric components of the prismatic configuration are shown in FIG. 8 to be slightly separated for illustrative purposes, as in actual inventive practice they are combined to form an integral, box-like structure 30. According to generally preferred inventive practice, the planar faces 310 of a superconductor bank 31 are joined together as a continuum, each adjacent pair of faces 310 being joined along the respective planar edges (forming an edge junction 311 such as indicated in FIG. 8) so as to preclude the existence of a Josephson junction between the adjacent faces 310; nevertheless, the present invention can be practiced whereby, in the case of at least one joined pair of adjacent faces 310, a Josephson junction is present between the adjacent faces 310.

The present invention is not to be limited by the embodiments described or illustrated herein, which are given by way of example and not of limitation. Other embodiments of the present invention will be apparent to those skilled in the art from a consideration of this disclosure or from practice of the present invention disclosed herein. Various omissions, modifications and changes to the principles disclosed herein may be made by one skilled in the art without departing from the true scope and spirit of the present invention, which is indicated by the following claims.

What is claimed is:
1. A magnetic sensing system comprising:
   a hollow cylindric structure that includes at least three annular layers, said hollow cylindric structure being characterized by a geometric axis, an axial hole, and two opposite ends, each said annular layer lying in a geometric plane that is perpendicular to said geometric axis, said at least three annular layers being at least one annular non-superconductive layer and at least two annular superconductive layers, a first said annular superconductive layer being situated at a first said end, a second said annular superconductive layer being situated at a second said end, said at least three annular layers including at least one annular Josephson junction, each said annular Josephson junction being constituted by two said annular superconductive layers and a said annular non-superconductive layer situated therebetween;
   a power source for imparting an electrical bias current to said hollow cylindric structure so that said electrical bias current is conducted through said hollow cylindric structure along said geometric axis from said first annular superconductive layer to said second annular superconductive layer, said power source being electrically connected to said first annular superconductive layer, said at least one annular Josephson junction being characterized by an electrical critical current, said electrical critical current being the maximum electrical current across said at least one annular Josephson junction before said at least one annular Josephson junction manifests electrical resistance and an electrical voltage; and
   a voltage measurement device for measuring a said electrical voltage that is associated with said electrical critical current and with an external magnetic field that is aligned with said geometric axis and extends through said axial hole, said voltage measurement device being electrically connected to said second annular superconductive layer and said power source, the measured said electrical voltage being indicative of the strength of said external magnetic field.

2. The magnetic sensing system of claim 1, wherein said at least three annular layers is at least five annular layers, and wherein said at least five annular layers includes at least two said annular Josephson junctions.

3. The magnetic sensing system of claim 2, said device further comprising at least one shunt, each said shunt connecting at least two said annular layers corresponding to different said annular Josephson junctions.

4. The magnetic sensing system of claim 1, wherein each said annular superconductive layer is composed of c-axis superconductor material.

5. The magnetic sensing system of claim 1, wherein each said annular superconductive layer is composed of a-axis high temperature superconductor material, each said annular superconductive layer being formed by the edgewise adjoining connection of at least three planar structures composed of said a-axis high temperature superconductor material, each said annular superconductive layer thereby defining the geometric lateral surface of a geometric prism.

6. Magnetic sensing apparatus comprising a hollow cylindric structure, an electrical current source, and a voltage measurement device;
   said hollow cylindric structure having a geometric longitudinal axis, a longitudinal hole, and two geometric longitudinal ends, said hollow cylindric structure including at least three annular layers, each said annular layer lying in a geometric plane that is perpendicular to said geometric axis, said at least three annular layers being at least one annular non-superconductor layer and at least two annular superconductor layers;

said at least three annular layers including at least one combination of two said annular superconductor layers and a said annular non-superconductor layer situated therebetween, said at least one combination representing at least one annular Josephson junction, each said combination representing a said annular Josephson junction, said at least one combination being characterized by a critical current, said critical current being the maximum electrical current across said at least one combination previous to manifestation, by said at least one combination, of an electrical resistance and a electrical voltage;

a first said annular superconductor layer being situated at a first said geometric longitudinal end and being electrically connected to said electrical current source, a second said annular superconductor layer being situated at a second said geometric longitudinal end and being electrically connected to said voltage measurement device, said electrical current source and said voltage measurement device being electrically connected to each other;

said electrical current source, said hollow cylindric structure, and said voltage measurement device forming an electrical circuit in which a bias current originating from said electrical current source is conducted, wherein said bias current:

enters said hollow cylindric structure at the first said geometric longitudinal end;

is conducted by said hollow cylindric structure in the direction of said geometric longitudinal axis;

exits said hollow cylindric structure at the second said geometric longitudinal end; and is encountered by said voltage measurement device so that said voltage measurement device detects a said electrical voltage that is indicative of the strength of an external magnetic field that is aligned with said geometric longitudinal axis and that extends through said longitudinal hole, the detected said electrical voltage being related to said critical current and said external magnetic field.

7. The magnetic sensing apparatus of claim 6, wherein said electrical power source is a first said electrical power source, wherein the magnetic sensing apparatus further comprises a second said electrical power source, and wherein the conduction of vortex-purposed electrical current originating from the second said electrical power source by at least one said annular superconductor layer results in the formation of at least one vortex in at least one of said at least one combination.

8. The magnetic sensing apparatus of claim 6, wherein said electrical power source is a first said electrical power source, wherein the magnetic sensing apparatus further comprises a second said electrical power source, and wherein the conduction of vortex-purposed electrical current originating from the second said electrical power source by at least two said annular superconductor layers results in the formation of at least two vortices moving in concert, each said vortex being formed in a different said combination.

9. The magnetic sensing apparatus of claim 6, wherein:

said at least three annular layers is at least five annular layers;

said at least five annular layers includes at least two said combinations;

the magnetic sensing apparatus further includes at least one shunt; and each said shunt connects at least two said annular layers corresponding to different said combinations.

10. The magnetic sensing system of claim 1 further comprising two annular electrodes, a first said annular electrode being positioned adjacent to the first said annular superconductive layer at the first said end, a second said annular electrode being positioned adjacent to the second said annular superconductive layer at the second said end.

11. The magnetic sensing system of claim 6 further comprising two annular electrodes, a first said annular electrode adjoining the first said annular superconductor layer at the first said geometric longitudinal end, a second said annular electrode adjoining the second said annular superconductor layer at the second said geometric longitudinal end.

12. The magnetic sensing system of claim 1, wherein said electrical critical current varies periodically with said external magnetic field and accordingly is periodically less than and greater than said electrical bias current.

13. The magnetic sensing system of claim 10, wherein said electrical critical current varies periodically with said external magnetic field and accordingly is periodically less than and greater than said electrical bias current.

14. The magnetic sensing system of claim 6, wherein said critical current varies periodically with said external magnetic field and accordingly is periodically less than and greater than said bias current.

15. The magnetic sensing system of claim 11, wherein said critical current varies periodically with said external magnetic field and accordingly is periodically less than and greater than said bias current.

* * * * *